(12) United States Patent
Tsai et al.

(10) Patent No.: US 11,125,809 B2
(45) Date of Patent: Sep. 21, 2021

(54) CHIP TESTING DEVICE

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS, Santa Clara, CA (US)

(*) Notice: Subject to any disclaimer, the term of this patent is extended or adjusted under 35 U.S.C. 154(b) by 103 days.

(21) Appl. No.: 16/733,238

(22) Filed: Jan. 3, 2020

(65) Prior Publication Data

US 2021/0018557 A1    Jan. 21, 2021

(30) Foreign Application Priority Data

Jul. 17, 2019   (TW) ................................. 108125207

(51) Int. Cl.
*G01R 31/28*     (2006.01)
*G11C 29/50*     (2006.01)
*H04B 1/02*      (2006.01)

(52) U.S. Cl.
CPC ..... *G01R 31/2834* (2013.01); *G01R 31/2839* (2013.01); *G01R 31/2844* (2013.01); *G11C 29/50* (2013.01); *H04B 1/02* (2013.01)

(58) Field of Classification Search
None
See application file for complete search history.

(56) References Cited

U.S. PATENT DOCUMENTS

| | | | | |
|---|---|---|---|---|
| 11,022,643 | B2 * | 6/2021 | Tsai | G01R 31/2874 |
| 2011/0248737 | A1 * | 10/2011 | Takeshita | G01R 31/2889 |
| | | | | 324/756.02 |
| 2020/0355740 | A1 * | 11/2020 | Tsai | G01R 1/06716 |
| 2021/0018558 | A1 * | 1/2021 | Tsai | G01R 31/2844 |
| 2021/0018559 | A1 * | 1/2021 | Tsai | G11C 29/44 |
| 2021/0132140 | A1 * | 5/2021 | Tsai | G11C 29/56 |

* cited by examiner

*Primary Examiner* — Jermele M Hollington
(74) *Attorney, Agent, or Firm* — Li & Cai Intellectual Property Office

(57) ABSTRACT

A chip testing device for being transferred among a plurality of working stations includes a circuit board, a control set, and a plurality of connection terminals. The circuit board is provided with a plurality of electrical connection sockets disposed thereon each for carrying a chip. The control set includes a plurality of testing modules disposed on the circuit board. The connection terminals are disposed on the circuit board. When the connection terminals are connected to an external power supply device, the testing modules are connected to the electrical connection sockets, and each of the testing modules is able to test the chip on the electrical connection socket connected thereto.

15 Claims, 30 Drawing Sheets

CHIP TESTING DEVICE

CROSS-REFERENCE TO RELATED PATENT APPLICATION

This application claims the benefit of priority to Taiwan Patent Application No. 108125207, filed on Jul. 17, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip testing device, and more particularly to a chip testing device for testing memory chips.

BACKGROUND OF THE DISCLOSURE

In general, a memory chip needs to pass a high temperature test and a burn-in test, or needs to pass a high temperature test, a burn-in test, and a low temperature test before leaving the factory. When a conventional memory chip testing apparatus performs a high temperature test, a low temperature test, and a burn-in test on a memory chip, the memory chip is repeatedly detached from and mounted to different electrical connection sockets. However, such repeated detachment and mounting of the memory chip in the testing process can easily result in time waste, low testing efficiency, and damage to contacts of the memory of the memory chip.

SUMMARY OF THE DISCLOSURE

In response to the above-referenced technical inadequacies, the present disclosure provides a chip testing device to effectively improve issues associated with conventional memory chip testing apparatuses (e.g., since a memory chip is repeatedly detached and mounted by the conventional memory chip testing apparatuses when being tested in environments having different temperatures, contacts of the memory chip are easily damaged, and testing efficiency is low).

In one aspect, the present disclosure provides a chip testing device for carrying a plurality of chips and being transferred among a plurality of working stations through a transferring device. The chip testing device includes a circuit board, a plurality of electrical connection sockets, a control set, and at least one power supply member. The circuit board has a first board surface and a second board surface respectively defined by two opposite sides thereof. The electrical connection sockets are fixed onto the first board surface of the circuit board. Each of the electrical connection sockets is configured to carry one of the chips. The electrical connection sockets are divided into a plurality of socket groups, and each of the socket groups has at least one of the electrical connection sockets. The control set is disposed on the second board surface of the circuit board and includes a plurality of testing modules. The testing modules are connected to the socket groups, and each of the testing modules is connected to the at least one of the electrical connection sockets of the corresponding socket group. The at least one power supply member is connected to the circuit board. The chip testing device is connected to an external power supply apparatus through the at least one power supply member so as to receive electricity for an operation of each of the testing modules. When the chip testing device receives electricity provided from the external power supply apparatus through the at least one power supply member, each of the testing modules is allowed to perform a predetermined testing process on at least one of the chips disposed on the at least one of the electrical connection sockets of the corresponding socket group connected thereto.

Therefore, the chip testing device of the present disclosure applied to a memory chip test can be used to carry a plurality of chips and can be transferred to a high temperature environment or a low temperature environment through a relevant robotic arm, so that the chips can be tested by providing electricity to the chip testing device. In other words, when the chips are tested in the high temperature environment or the low temperature environment, the chips do not need to be detached from the electrical connection sockets. Accordingly, the chip testing device of the present disclosure can be used to effectively reduce testing time of the chips, and can be used to prevent the issues associated with conventional memory chip testing apparatuses.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
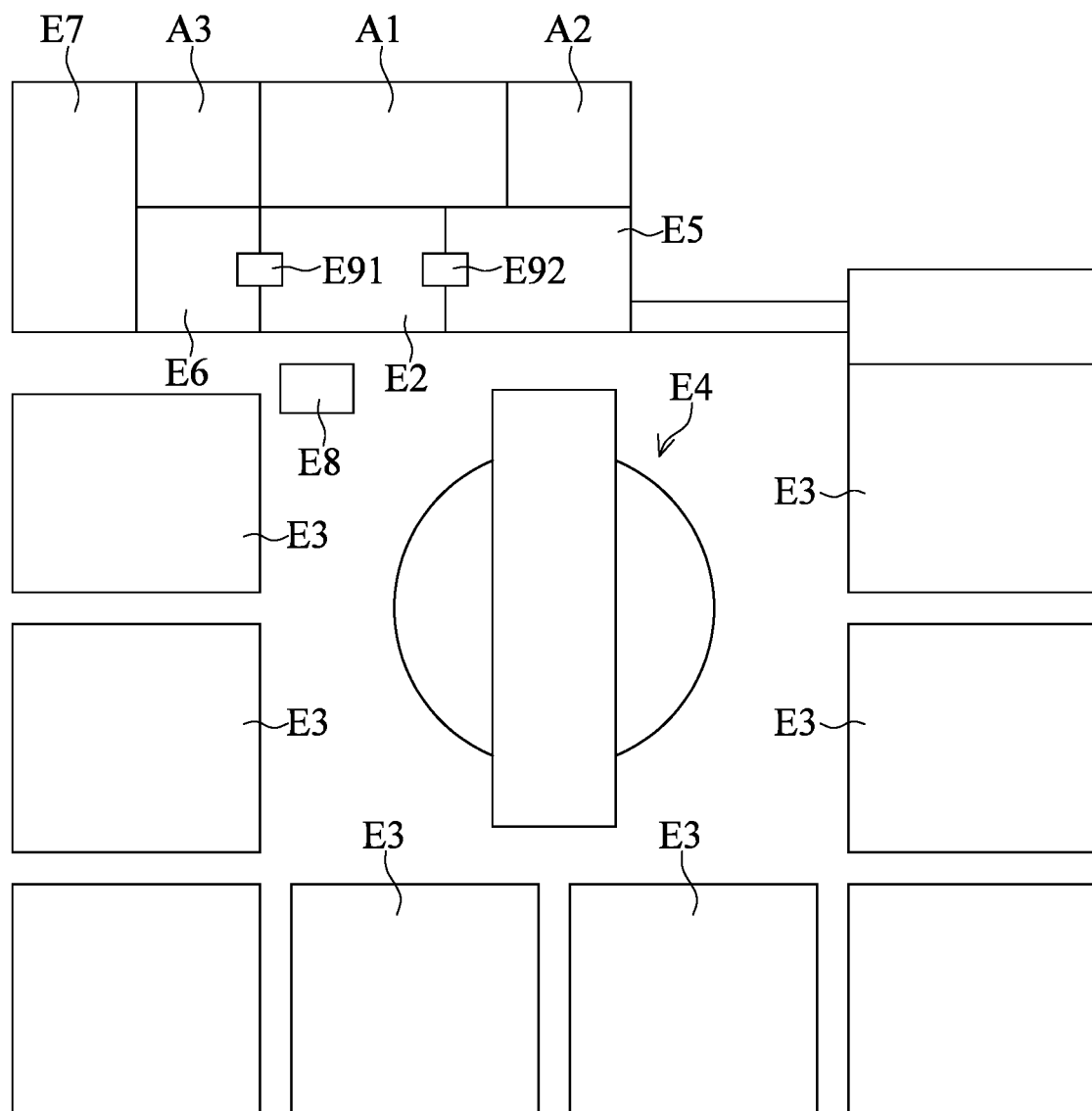
FIG. 1 is a schematic view of a chip testing system according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
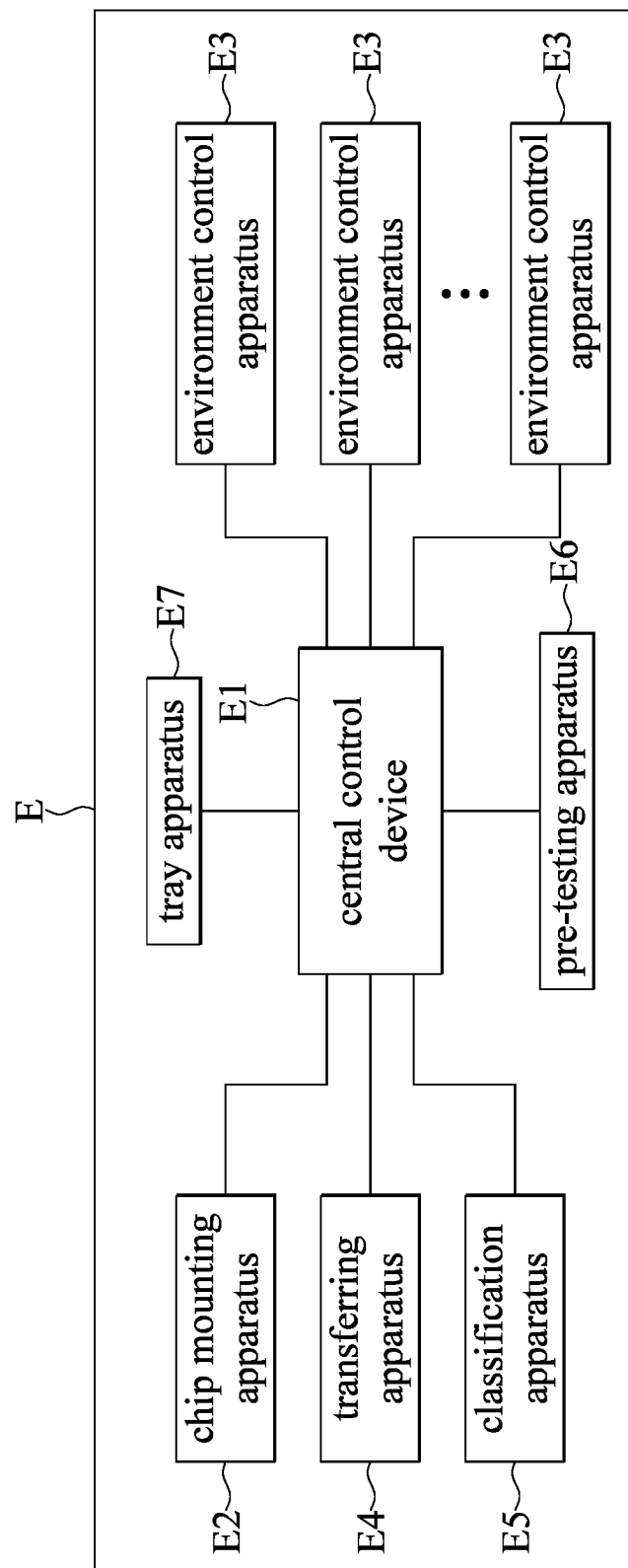
FIG. 2 is a functional block view of the chip testing system according to the present disclosure.
Figure 3:
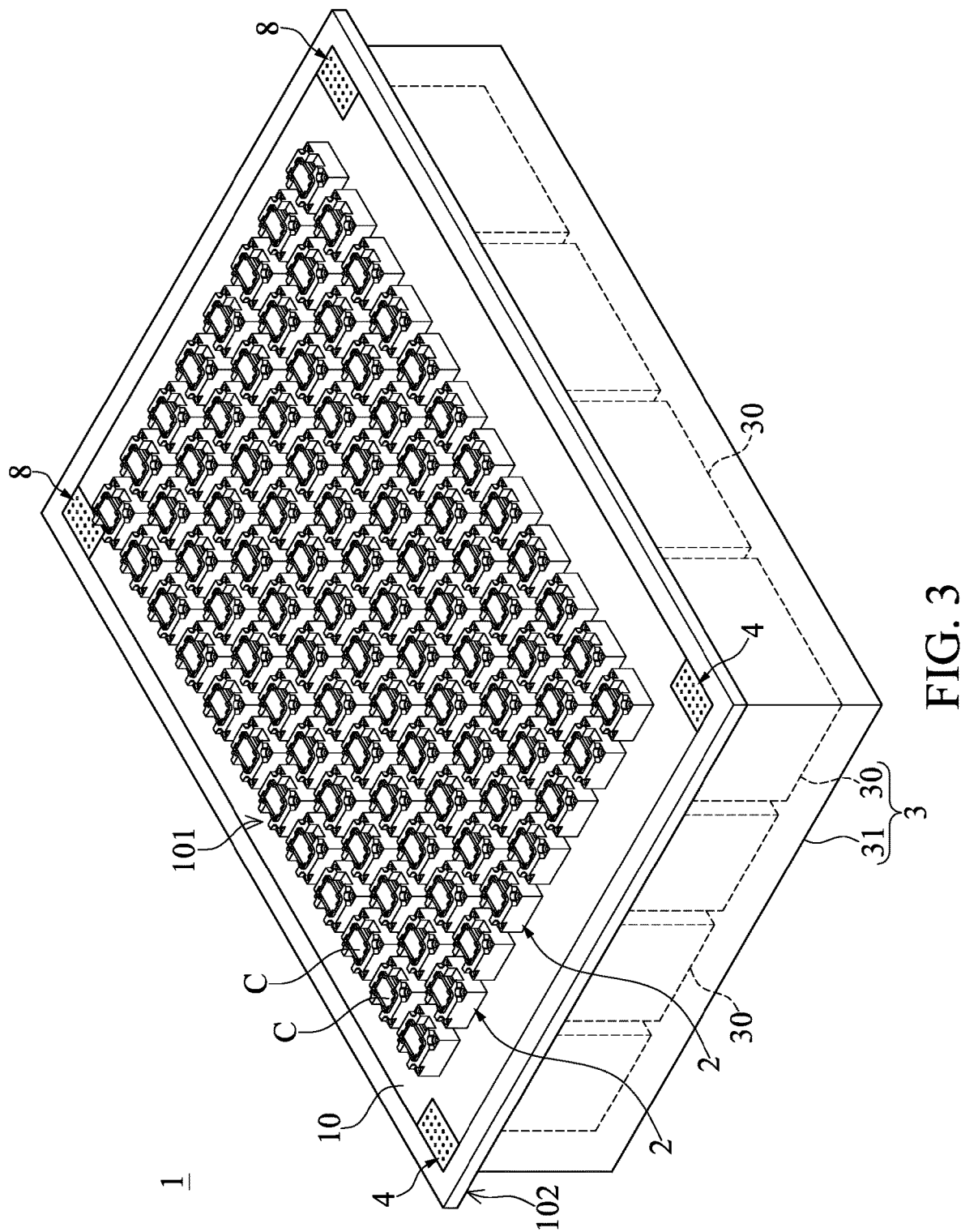
FIG. 3 is a perspective view of a chip testing device of the chip testing device according to the present disclosure.

Referring to FIG. 1 to FIG. 3, FIG. 1 is a schematic view of a chip testing system according to the present disclosure, FIG. 2 is a functional block diagram of the chip testing system according to the present disclosure, and FIG. 3 is a perspective view of a chip testing device according to the present disclosure. The chip testing system E of the present disclosure is configured to test a plurality of chips C. The chip testing system E includes a central control device E1, a chip mounting apparatus E2, at least one chip testing device 1, a plurality of environment control apparatuses E3, a transferring apparatus E4, and a classification apparatus E5.

The central control device E1 is connected to the chip mounting apparatus E2, the environment control apparatuses E3, the transferring apparatus E4, and the classification apparatus E5, and can control the operation of each of the above apparatuses. The central control device E1 can be a server or a computer apparatus, but the present disclosure is not limited thereto. The chip mounting apparatus E2 can include a robotic arm (not shown) that is controllable by the central control device E2 to transfer the chips C one by one from a tray onto a plurality of electrical connection sockets 2 of the chip testing device 1.

Figure 4:
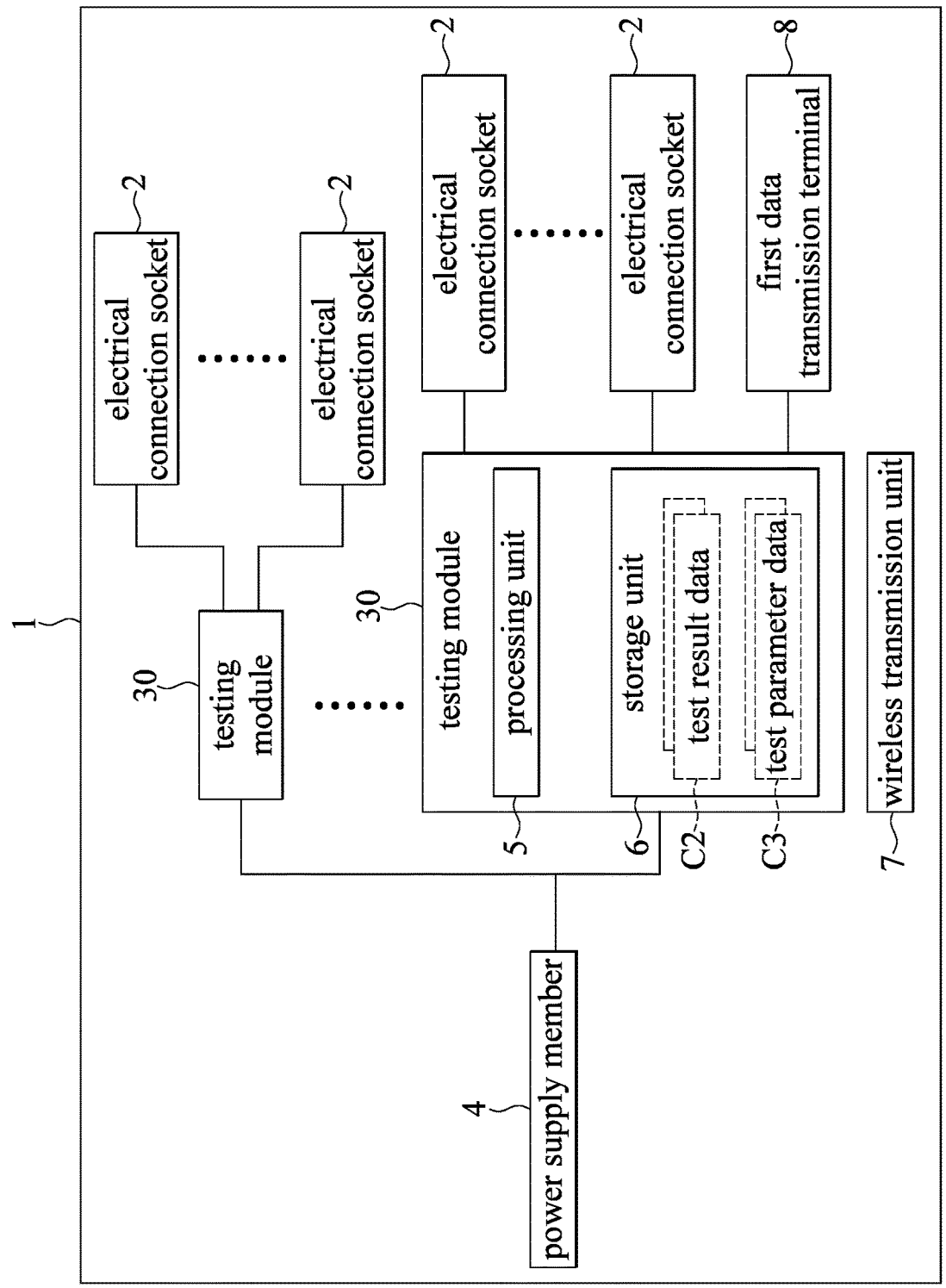
FIG. 4 is a functional block view of the chip testing device of the chip testing system according to the present disclosure.

As shown in FIG. 2 to FIG. 4, FIG. 4 is a functional block diagram of the chip testing device 1. The chip testing device 1 is configured to carry the chips C, and can be moved among a plurality of working stations (e.g., the chip mounting apparatus E2, the environment control apparatuses E3, the transferring apparatus E4, and the classification apparatus E5) by the transferring apparatus E4.

The chip testing device 1 includes a circuit board 10, a plurality of electrical connection sockets 2, a control set 3, and at least one power supply member 4. The circuit board 10 has a first board surface 101 and a second board surface 102 respectively defined by two opposite sides thereof. The electrical connection sockets 2 are fixed onto the first board surface 101 of the circuit board 10, and each of the electrical connection sockets 2 is configured to carry one of the chips C. The structure of the electrical connection socket 2 can be changed according to that of the chip C, and the present disclosure is not limited thereto.

In a practical application, the electrical connection sockets 2 can be divided into a plurality of socket groups, and each of the socket groups has at least one of the electrical connection sockets 2. The control set 3 is disposed on the second board surface 102 of the circuit board 10, and includes a plurality of testing modules 30. Each of the testing modules 30 is connected to one of the socket groups.

Specifically, as shown in FIG. 3 of the present embodiment, the number of the electrical connection sockets 2 on the circuit board 10 is ninety-six, and the ninety-six electrical connection sockets 2 can be divided into sixteen socket groups. That is to say, each of the socket groups has six of the electrical connection sockets 2 connected to the same testing module 30. In other words, the circuit board 10 shown in FIG. 3 is provided with sixteen testing modules 30. In addition, the number of the electrical connection sockets 2 on the circuit board 10 and the number of the socket groups can be changed according to design requirements.

When each of the testing modules 30 is supplied with electricity, any one of the testing modules 30 can perform a predetermined testing process on the chips C on the electrical connection sockets 2 connected thereto. For example, the chip C can be a memory chip (e.g., a NAND flash memory chip), and each of the testing modules 30 can test the memory chip by at least one of a reading test, a writing test, and an electrical property test. In an embodiment of the present disclosure about each of the testing modules 30 used for testing the memory chip, each of the testing modules 30 can include a pattern generator (PG), a device power supply (DPS), and a driver.

Since the electrical connection sockets 2 on the circuit board 10 are respectively connected to the testing modules 30, a signal transmission between any one of the testing modules 30 and the chips C on the corresponding electrical connection sockets 2 can be faster and is not easy to decay. Specifically, if the circuit board 10 provided with the ninety-six electrical connection sockets 2 is only connected to a single signal input source, when a signal is emitted from the signal input source across the circuit board 10, the signal would have a decay issue that may cause an inaccurate test result of a chip.

In a practical application, the electrical connection sockets 2 of each of the socket groups can be connected in a parallel connection, and connected to the same testing module 30. In other words, the electrical connection sockets 2 connected to any one of the testing modules 30 are connected in a parallel connection. In addition, any one of the electrical connection sockets 2 of one of the socket groups is not connected to any one of the electrical connection sockets 2 of another one of the socket groups. For example, four electrical connection sockets 2 (i.e., Z1, Z2, Q1, and Q2) disposed on the circuit board 10 are divided into two socket groups that are respectively defined as a first socket group and a second socket group. The first socket group includes the two electrical connection sockets Z1, Z2 that are connected in a parallel connection, and the second socket group includes the two electrical connection sockets Q1, Q2 that are connected in a parallel connection. Specifically, the electrical connection socket Z1 is not connected to the two electrical connection sockets Q1, Q2, and the electrical connection socket Z2 is not connected to the two electrical connection sockets Q1, Q2.

It should be noted that the electrical connection sockets 2 respectively belonging to different socket groups can be not connected to each other. When the chip testing device 1 fails, the socket groups can be can be tested one by one for quickly finding a broken electrical connection socket 2, and the chip testing device 1 can be repaired by simply replacing the broken electrical connection socket 2, components of the broken electrical connection socket 2, the socket group having the broken electrical connection socket 2, or the testing module 30 corresponding to the broken electrical connection socket 2. Accordingly, the chip testing device 1 can be repaired without replacing all of the electrical connection sockets 2 and all of the testing modules 30 both on the circuit board 10.

As shown in FIG. 3, in a practical application, the chip testing device 1 can further include a chassis 31 fixed to the second board surface 102 of the circuit board 10 so as to cover and protect the testing modules 30. In other embodiments of the present disclosure, the chassis 31 can be provided with a heat dissipating device (e.g., a fan or heat dissipation fins) according to design requirements. As shown in FIG. 3 of the present embodiment, the number of the chassis 31 of the chip testing device 1 is only one, and the chassis 31 covers the testing modules 30, but the number of the chassis 31 of the chip testing device 1 of the present disclosure is not limited to one. In other embodiments of the present disclosure, the chip testing device 1 can include a plurality of chassis 31, and each of the chassis 31 can cover the same number (e.g., one, two, or three) of the testing modules 30.

The power supply member 4 is disposed on and connected to the circuit board 10, and is connected to the testing modules 30 through the circuit board 10. The power supply member 4 can be a board-to-board connector having pogo pins or reeds, but the present disclosure is not limited thereto. As shown in FIG. 3 of the present embodiment, the power supply member 4 includes a plurality of connection terminals, and is disposed on the first board surface 101 of the circuit board 10, but the configuration, number, and position of the power supply member 4 of the present disclosure is not limited to FIG. 3.

The power supply member 4 is configured to connect to an external power supply apparatus that can provide electricity to each of the testing modules 30 through the power supply member 4. The external power supply apparatus is independent from the chip testing device 1 and can be any apparatus enabling to provide electricity, but the present disclosure is not limited thereto. Moreover, when the chip testing device 1 is not connected to the external power supply apparatus through the power supply member 4, each of the testing modules 30 does not have electricity to perform a predetermined testing process on the chips C connected thereto. However, in other embodiments of the present disclosure, the chip testing device 1 can be provided with at least one battery connected to the testing modules 30, and the at least one battery can provide electricity to the testing modules 30.

In an embodiment of the present disclosure, the power supply member 4 can include a receiving antenna, and can receive electricity in a wireless manner so as to provide electricity to each of the testing modules 30. Moreover, the chip testing device 1 can include a charging battery module connected to the power supply member 4, and the power supply member 4 can receive electricity in a wireless manner so as to provide electricity to the charging battery module. Specifically, electricity for driving each of the testing modules 30 to test the chips C can be provided from the charging battery module or the external power supply apparatus through the receiving antenna (i.e., the power supply member 4). The power supply member 4 can be not exposed from the chip testing device 1, and is embedded in the circuit board 10 or arranged in the chip testing device 1. In addition, the number of the power supply member 4 of the chip testing device 1 is not limited to one, and can be changed according to design requirements.

As shown in FIG. 3, FIG. 4, FIG. 9, and FIG. 10, the chip testing device 1 can further include a plurality of first data transmission terminals 8, and each of the accommodating chambers E311 can be provided with a plurality of second data transmission terminals E32. The first data transmission terminals 8 can contact the second data transmission terminals E32 to jointly transmit data. In a practical application, each of the first data transmission terminals 8 or each of the second data transmission terminals E32 can be a pogo pin or a reed, but the present disclosure is not limited thereto. The number and position of the first data transmission terminal 8 or the second data transmission terminal E32 can be changed according to design requirements.

In other embodiments of the present disclosure, the chip testing device 1 can include at least one first data transmission antenna (not shown), and each of the accommodating chambers E311 can be provided with at least one second data transmission antenna (not shown). The first data transmission antenna and the second data transmission antenna are cooperated with each other to jointly wirelessly transmit data. In a practical application, if the first data transmission antenna can transmit data to the second data transmission antenna in the accommodating chamber E311, the first data transmission antenna can be disposed at any position of the environment control apparatus E3.

Figure 5:
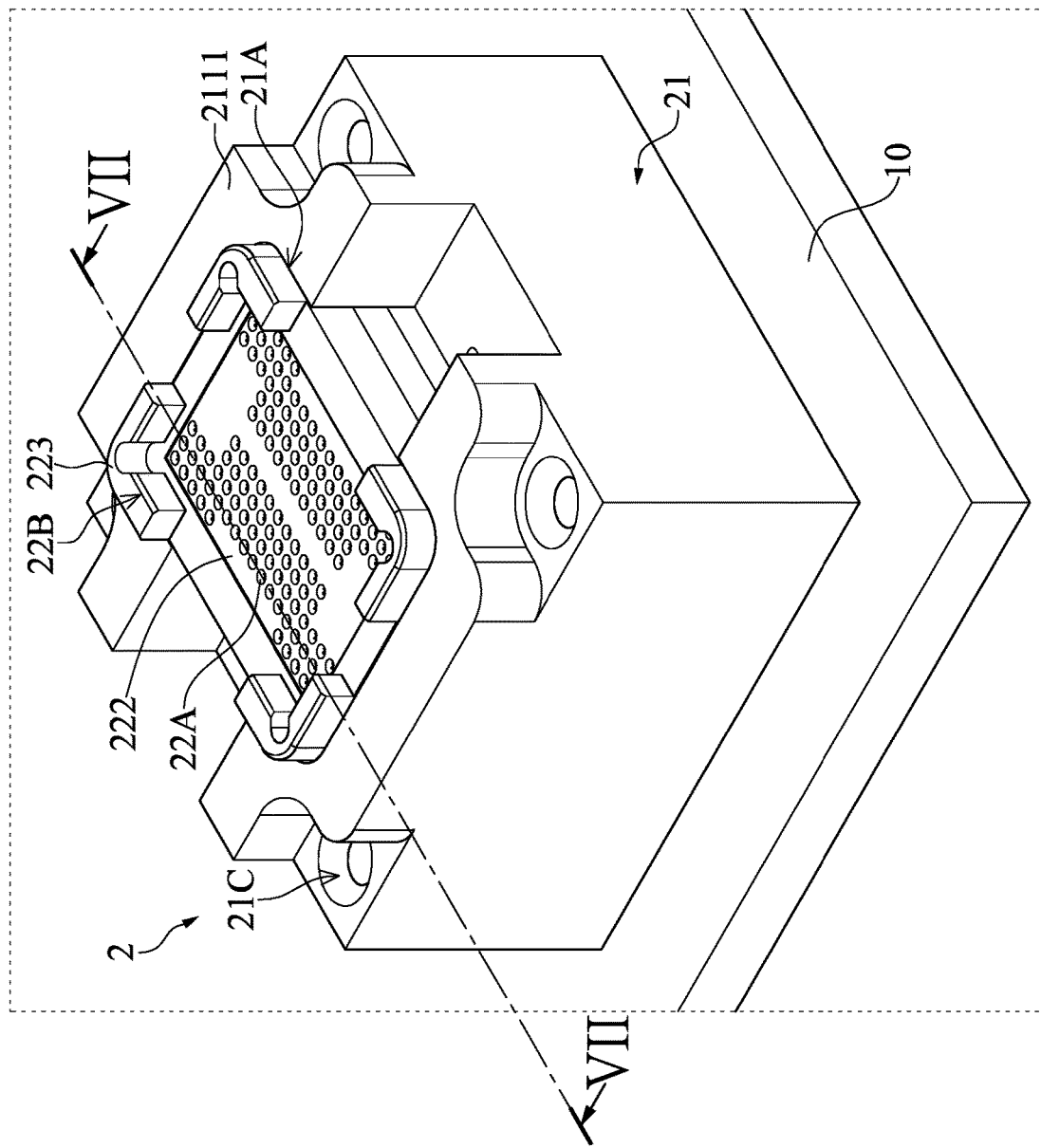
FIG. 5 is a perspective view of an electrical connection socket of the chip testing device according to the present disclosure.
Figure 6:
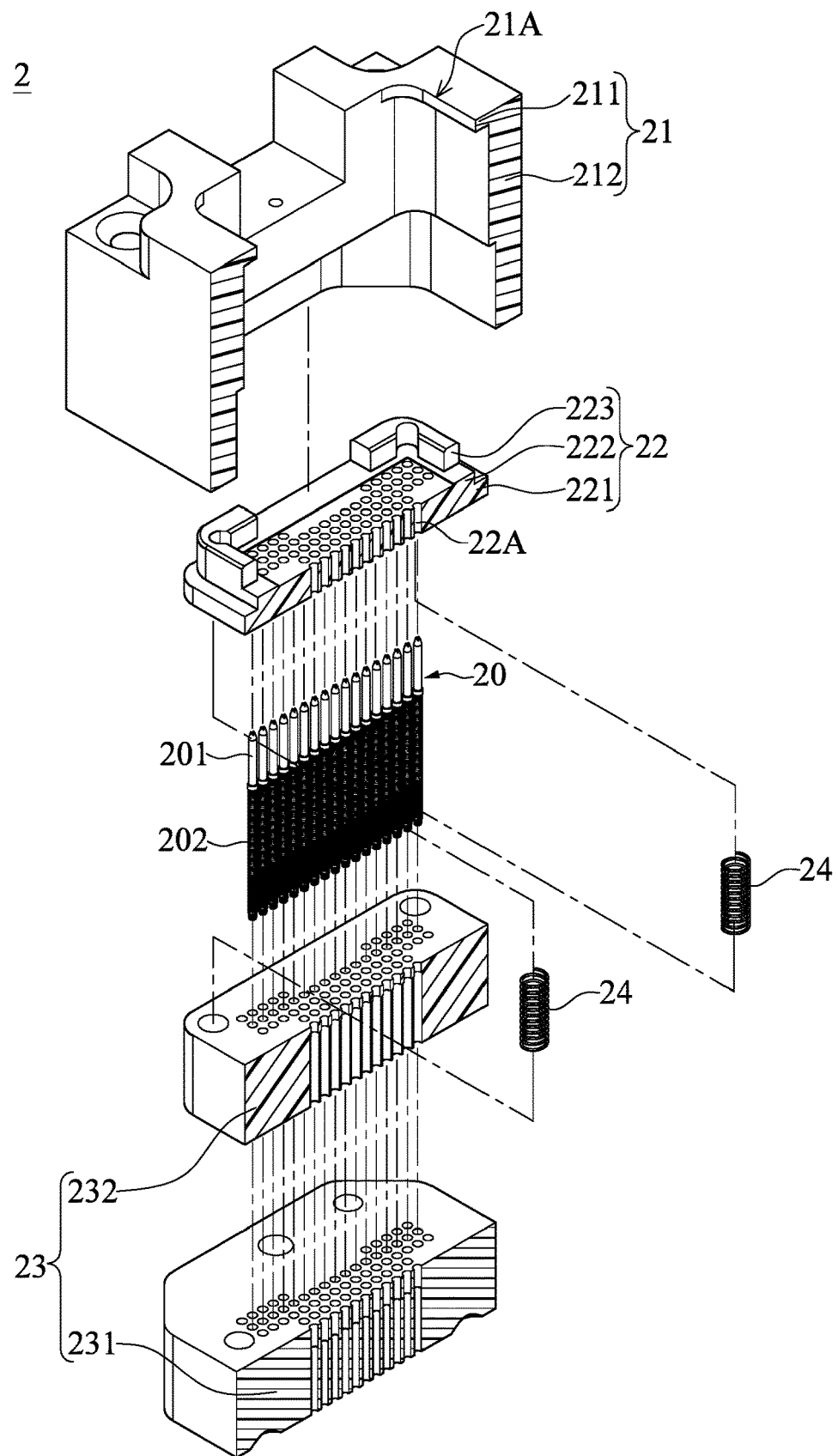
FIG. 6 is an exploded cross-sectional view of the electrical connection socket according to the present disclosure.
Figure 7:
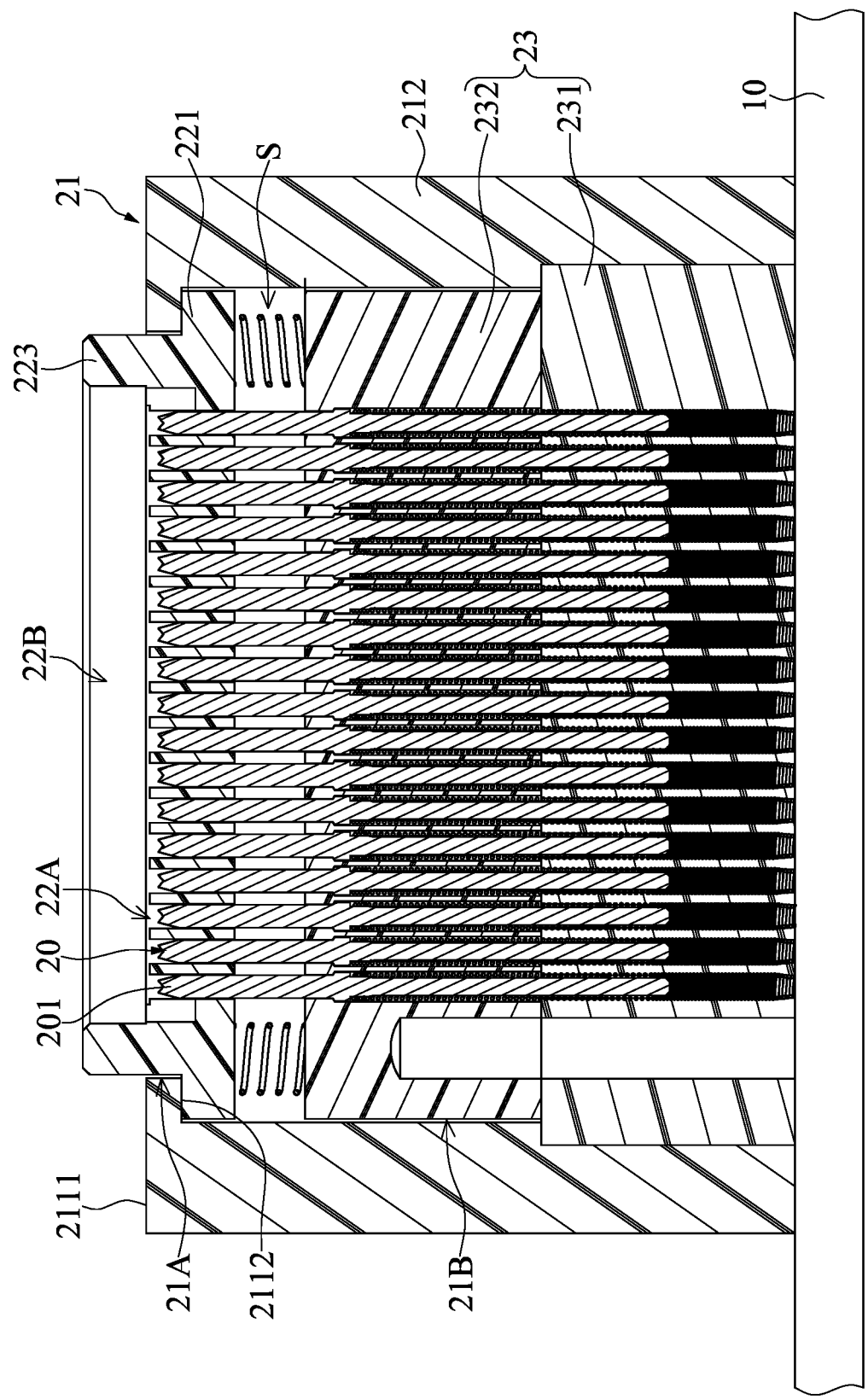
FIG. 7 is a cross-sectional view taken along line VII-VII of FIG. 5.
Figure 8:
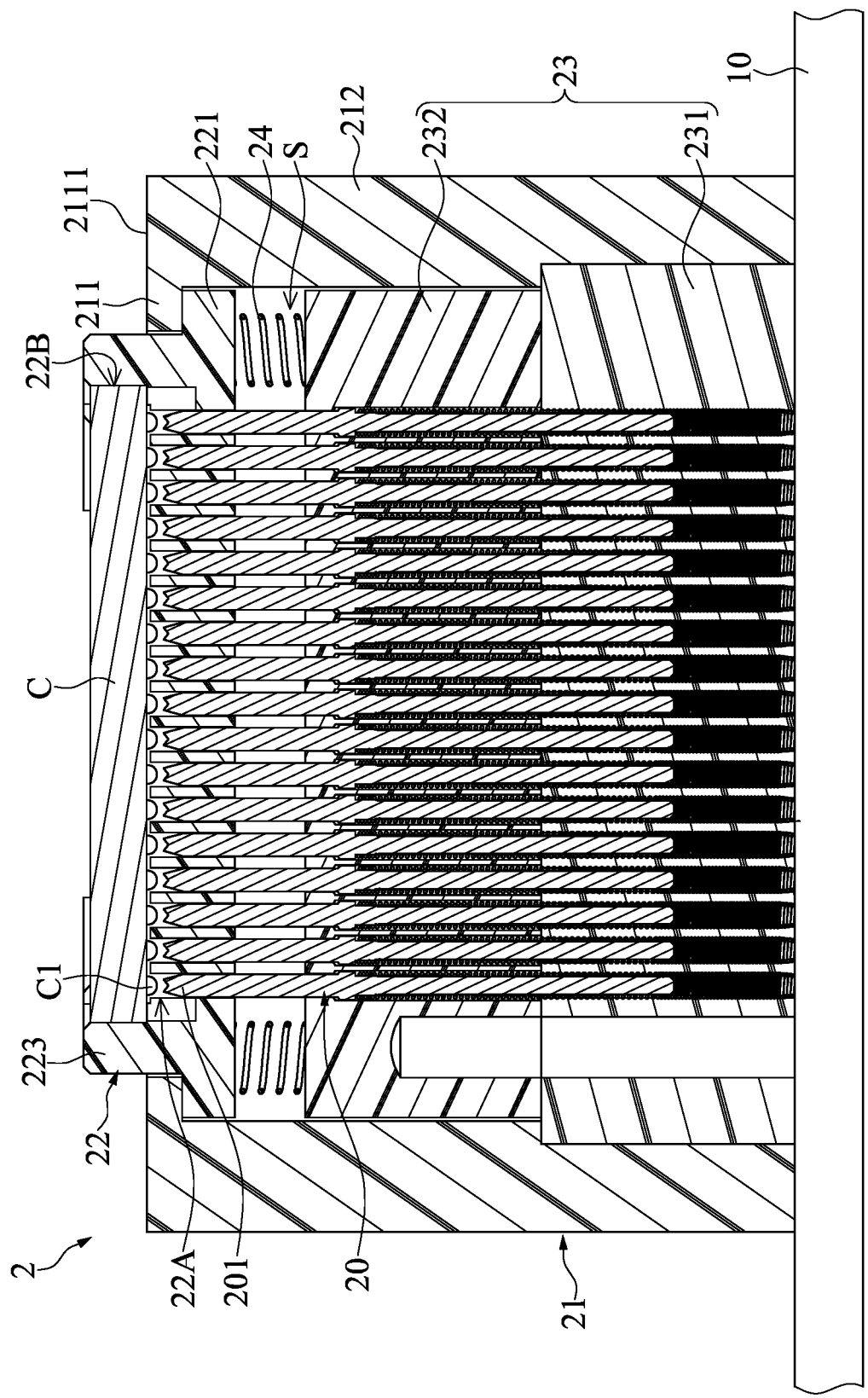
FIG. 8 is a cross-sectional view showing the electrical connection socket carrying a chip according to the present disclosure.

As shown in FIG. 5 to FIG. 8, FIG. 5 is a perspective view of one of the electrical connection sockets 2 of the chip testing device 1 according to the present disclosure, FIG. 6 is an exploded cross-sectional view of the electrical connection socket 2 according to the present disclosure, FIG. 7 is a cross-sectional view showing the electrical connection socket 2 without carrying any chip C, and FIG. 8 is a cross-sectional view showing the electrical connection socket 2 carrying a chip C.

Each of the electrical connection sockets 2 includes a plurality of probe assemblies 20, a socket body 21, a lift structure 22, a supporting structure 23, and a plurality of elastic assemblies 24. Each of the probe assemblies 20 includes a pin 201 and a spring 202 that is sleeved around the pin 201. An end of the pin 201 is configured to contact an electrical connection portion C1 of the chip C (shown in FIG. 8). When an end of the pin 201 is pressed, the spring 202 is pressed to generate an elastic returning force. Accordingly, when the pin 201 is no longer pressed, the spring 202 releases the elastic returning force to return the pin 201 to an initial position.

The socket body 21 has a top wall 211 and an annular wall 212. The top wall 211 has an opening 21A. One end of the annular wall 212 is connected to a peripheral edge of the top wall 211, and the other end of the annular wall 212 is disposed and fixed on the circuit board 10. The top wall 211, the annular wall 212, and the circuit board 1 jointly define an accommodating slot 21B. The top wall 211 has an inner surface 2111 arranged in the accommodating slot 21B and an outer surface 2112 opposite to the inner surface 2111 (as shown in FIG. 7). As shown in FIG. 5, the top wall 211 and the annular wall 212 can be integrally formed as a one-piece structure, and the socket body 21 has a plurality of screwing holes 21C for being cooperated with screwing members (e.g., screws) so as to fix the socket body 21 onto the circuit board 1, but the present disclosure is not limited thereto.

The lift structure 22 includes a base portion 221 and a carrying portion 222. The base portion 221 is entirely arranged in the accommodating slot 21B. The carrying portion 222 is formed by extending from the base portion 221, and is partially arranged in the opening 21A. The lift structure 22 includes four retaining portions 223 extending from the carrying portion 222 along a direction away from the base portion 221. The four retaining portions 223 can be respectively formed on four corners of the carrying portion 222. The four retaining portions 223 and the carrying portion 222 jointly form a chip receiving slot 22B for accommodating one of the chips C. The four retaining portions 223 are configured to engage with the chip C. The lift structure 22 further has a plurality of connection holes 22A (shown in FIG. 6) penetratingly formed through the base portion 221 and the carrying portion 222.

Each of the probe assemblies 20 is partially fixed in the supporting structure 23. One end of each of the probe assemblies 20 fixed in the supporting structure 23, which is defined as a first end, is connected to the circuit board 1. The other end of each of the probe assemblies 20 is defined as a second end, and the second ends of the probe assemblies 20 are respectively arranged in the connection holes 22A. The second ends of the probe assemblies 20 arranged in the connection holes 22A are configured to respectively connect with a plurality of electrical connection portions C2 of the chip C.

In a practical application, the supporting structure 23 can include a seat structure 231 and an auxiliary structure 232. The seat structure 231 is arranged in the accommodating slot 21B, and is fixed with the socket body 21 (e.g., the seat structure 231 and the socket body 21 are fixed to each other by screws). The seat structure 231 has a plurality of thru-holes, and the first ends of the probe assemblies 20 are fixed in the thru-holes. The auxiliary structure 232 is arranged in the accommodating slot 21B and between the seat structure 231 and the top wall 211, and the auxiliary structure 232 and the seat structure 231 are fixed to each other (e.g., by screws). The auxiliary structure 232 has a plurality of supporting holes spaced apart from each other. The supporting holes of the auxiliary structure 232 are respectively in spatial communication with the thru-holes of the seat structure 231, and respectively correspond in position to the connection holes 22A. The connection holes 22A, the supporting holes, and the thru-holes jointly define a plurality of probe channels, and the probe assemblies 20 are respectively arranged in the probe channels.

As shown in FIG. 7, the supporting structure 23 is arranged in the accommodating slot 21B, and the elastic assemblies 24 are disposed between the supporting structure 23 and the lift structure 22. The elastic assemblies 24 are configured to push the base portion 221 of the lift structure 22 to abut against the inner surface 2112 of the top wall 211, so that the base portion 221 and the supporting structure 23 have a gap S there-between. Specifically, when the electrical connection socket 2 is fixed to the circuit board 10 and the retaining portions 223 are not pressed by an external force, the four elastic assemblies 24 between the lift structure 22 and the supporting structure 23 can be slightly compressed to generate an elastic returning force that pushes the lift structure 22 to firmly abut against the inner surface 2112 of the top wall 211.

As shown in FIG. 8, when the chip receiving slot 22B receives the corresponding chip C and the retaining portions 223 are not pressed, the electrical connection portions C2 of the chip C are respectively arranged in the connecting holes 22A, and the probe assemblies 20 are not connected to (e.g., do not touch) the electrical connection portions C2 of the chip C. When the lift structure 22 is pressed, at least part of the lift structure 22 is moved into the socket body 21. In other words, the lift structure 22 is moved toward the circuit board 1 relative to the supporting structure 23, and the probe assemblies 20 would be in contact with the electrical connection portions C2 of the chip C.

Figure 9:
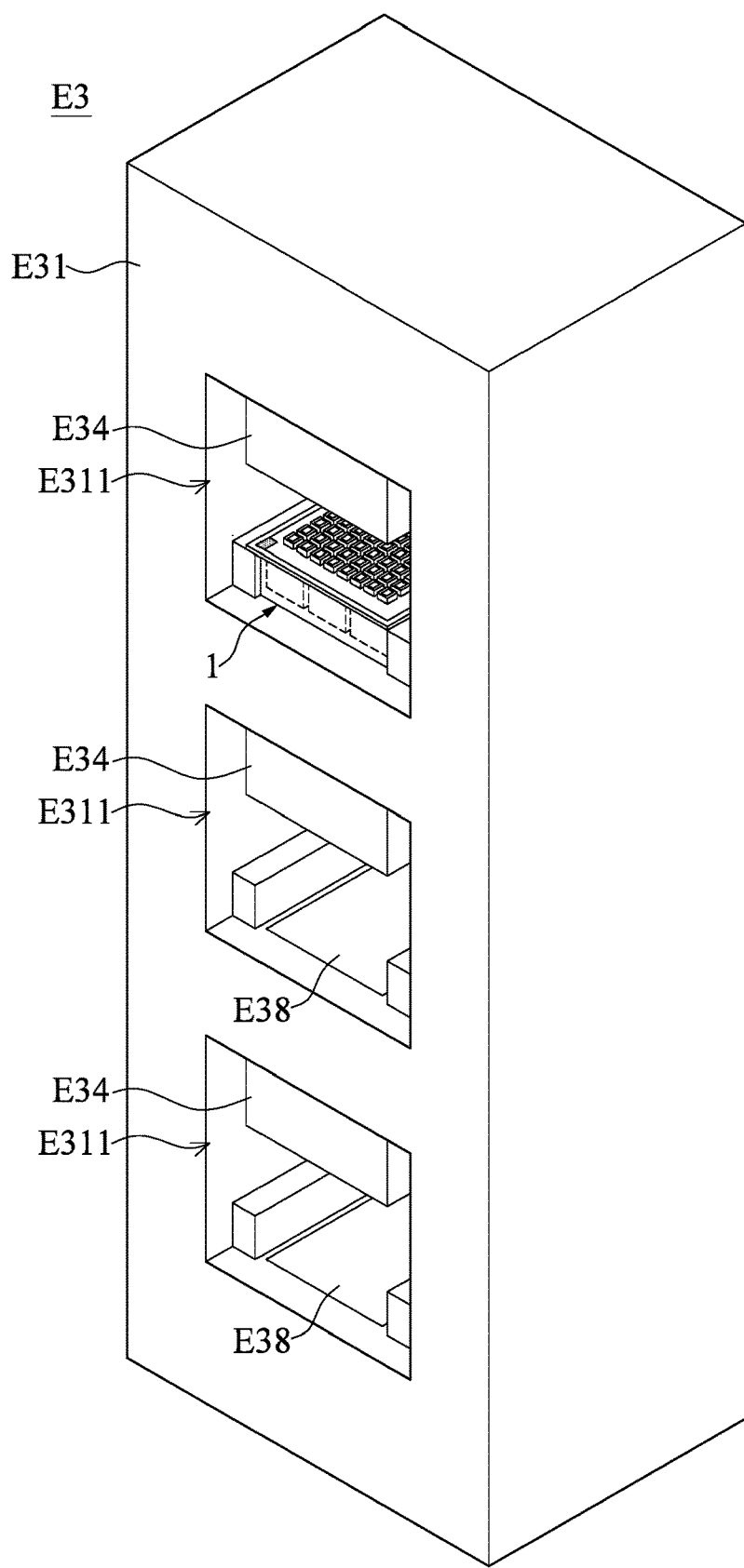
FIG. 9 is a perspective view of an environment control apparatus of the chip testing system according to the present disclosure.
Figure 10:
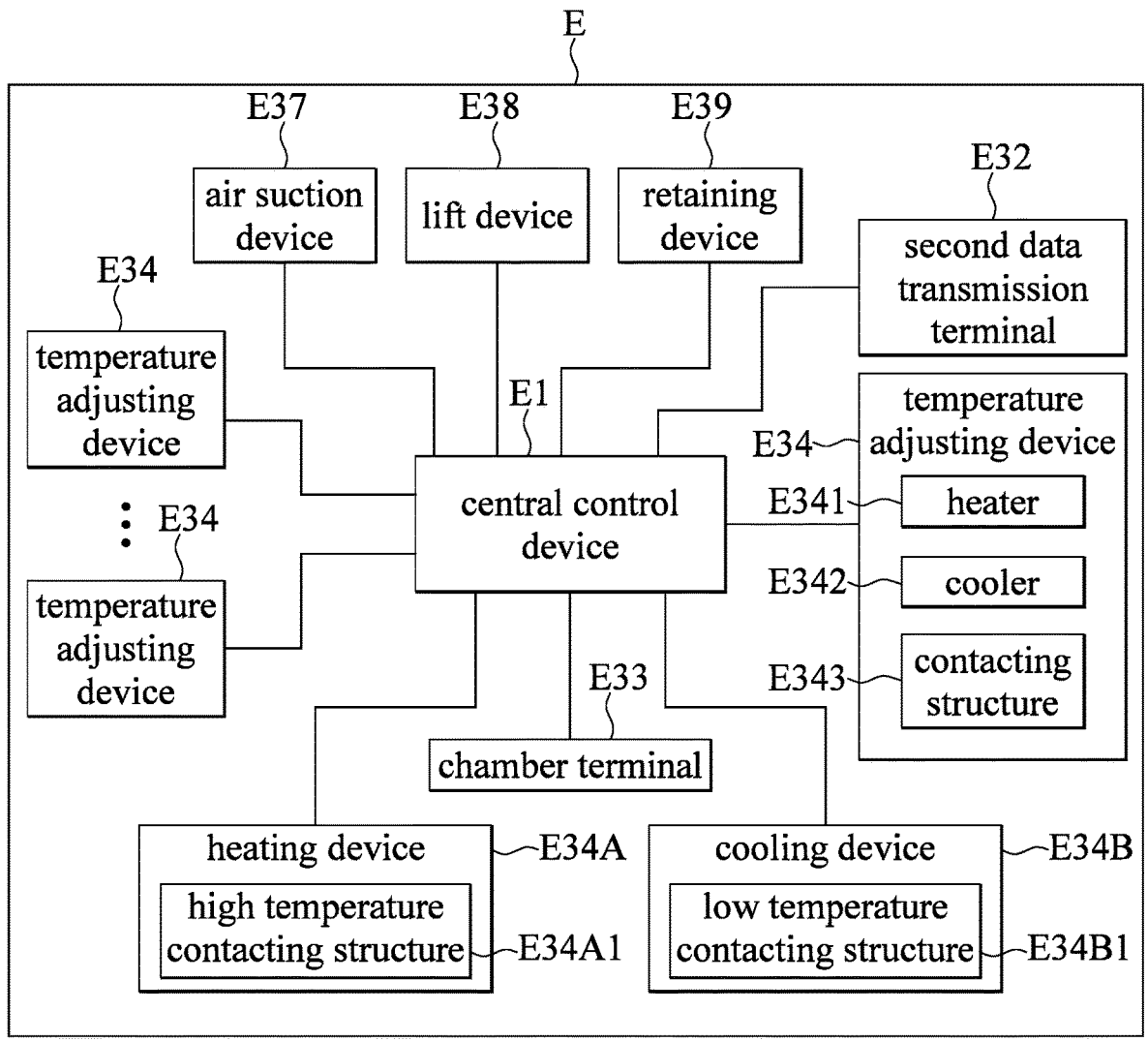
FIG. 10 is a functional block view of the environment control apparatus and a central control device of the chip testing system according to the present disclosure.
Figure 11:
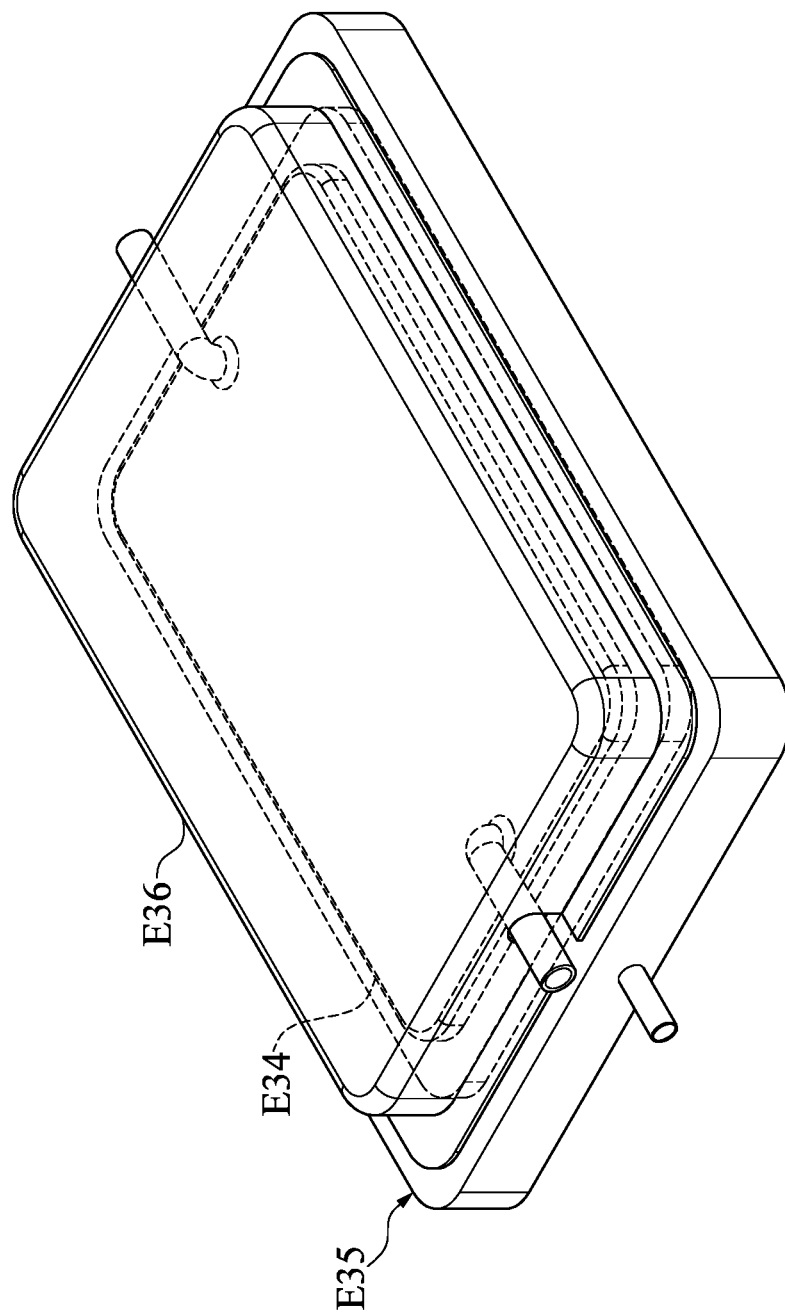
FIG. 11 is a perspective view of a temperature adjusting device and a cover of the chip testing system according to the present disclosure.
Figure 12:
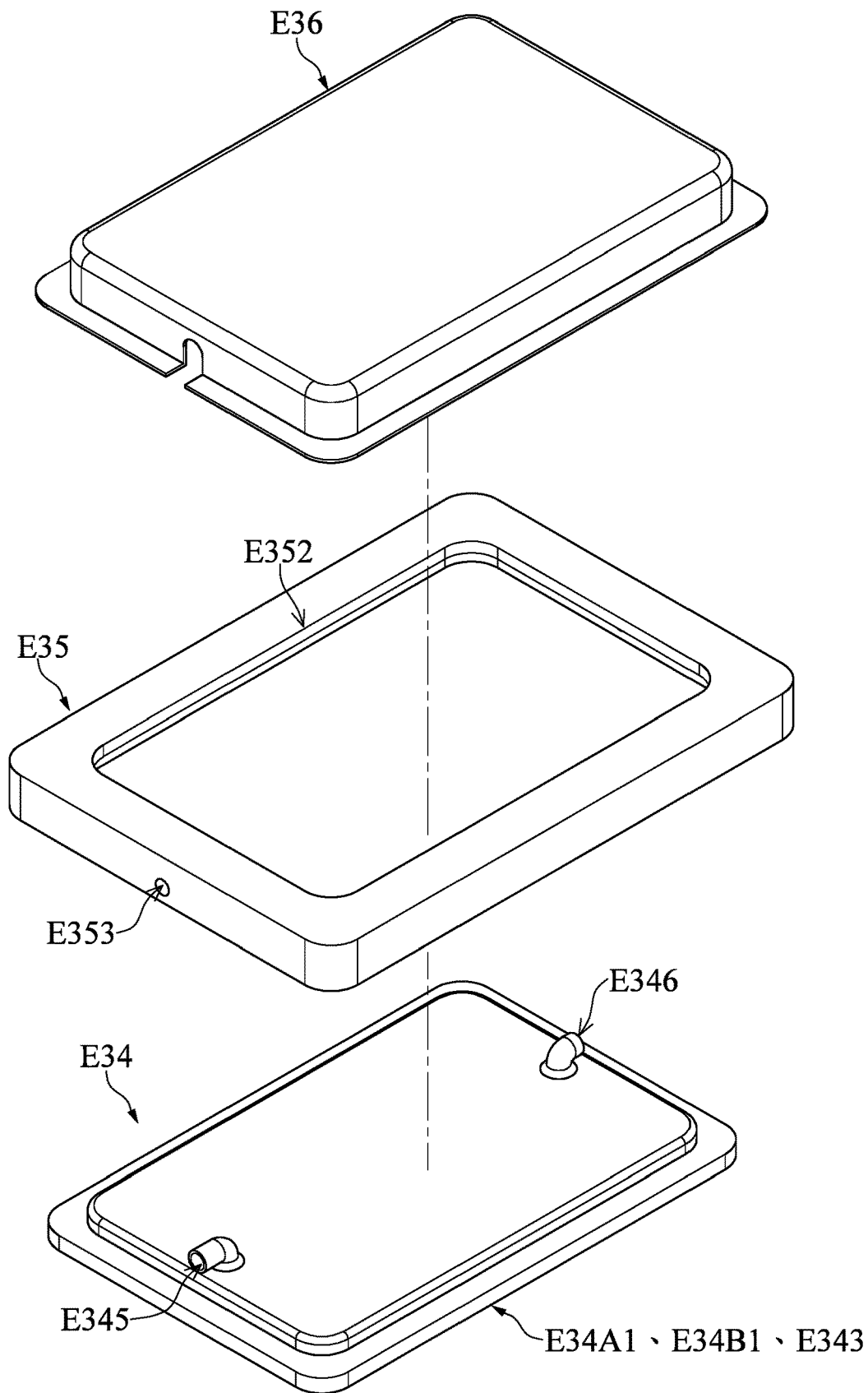
FIG. 12 and FIG. 13 are exploded views of the temperature adjusting device and the cover according to the present disclosure.
Figure 13:
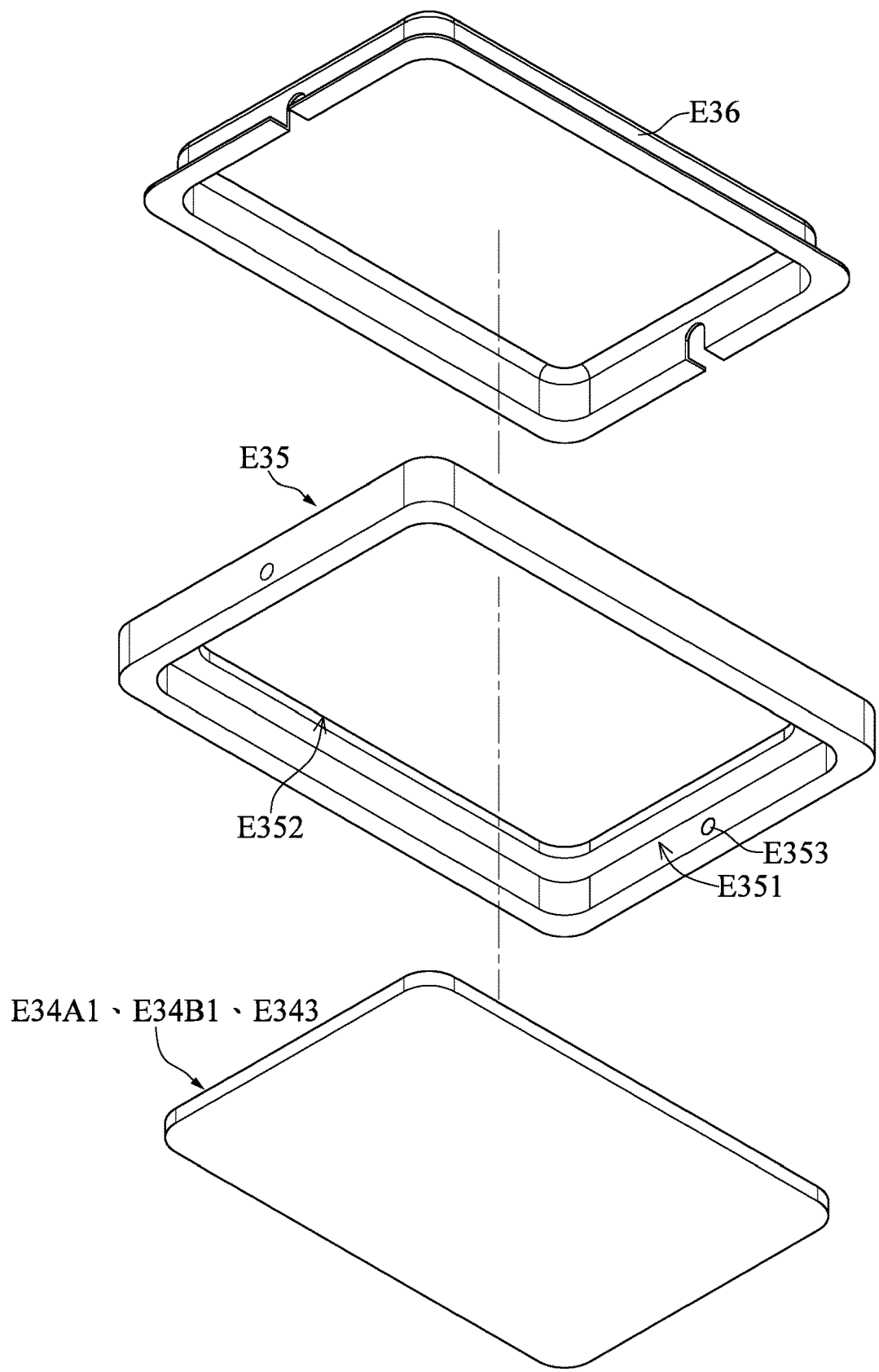

As shown in FIG. 3, FIG. 9, and FIG. 10, FIG. 9 is a perspective view of the environment control apparatus E3 according to the present disclosure. The environment control apparatuses E3 are connected to the central control device E1, and the central control device E1 can control any one of the environment control apparatuses E3 to be independently operated. Each of the environment control apparatuses E3 can generate an environment having a predetermined temperature (e.g., a predetermined high temperature or a predetermined low temperature), and can perform the predetermined testing process on the chips C on the chip testing device E1 in the environment.

Each of the environment control apparatuses E3 includes an apparatus body E31, a plurality of chamber terminals E33, and a plurality of temperature adjusting devices E34. The apparatus body E31 includes a plurality of accommodating chambers E311. In the present embodiment, the accommodating chamber E311 is configured to receive the chip testing device 1, and the accommodating chambers E311 of the environment control apparatus E3 can be or cannot be in a spatial communication with each other, but the present disclosure is not limited thereto.

In an embodiment of the present disclosure, the accommodating chambers E311 of the environment control apparatus E3 are independent from each other and are not in a spatial communication with each other, each of the accommodating chambers E311 has a movable door, and the environment control apparatus E3 is connected to an air suction apparatus. When the chip testing device 1 is arranged in the accommodating chamber E311, the central control device E1 can control the movable door to move for causing the accommodating chamber E311 to be an enclosed space, and the central control device E1 can further control the air suction apparatus to be operated so that the accommodating chamber E311 is in a substantial vacuum state. Accordingly, an inner temperature of the accommodating chamber E311 is not easy to be affected by an external environment.

In an embodiment of the present disclosure, the power supply member 4 of the chip testing device 1 has the connection terminals, each of the accommodating chambers E311 can be provided with a plurality of chamber terminals E33 therein that are configured to respectively connect to the connection terminals of the chip testing device 1. The position of the chamber terminals E33 is distributed according to the position of the chip testing device 1 in the accommodating chamber E311 and the position of the connection terminals of the power supply member 4, but the present disclosure is not limited thereto. In an embodiment of the present disclosure, the power supply member 4 of the chip testing device 1 is the receiving antenna, each of the accommodating chambers E311 is provided with an emitting antenna therein that can be used to wirelessly charge and is connected to the external power supply apparatus. When the chip testing device 1 is arranged in the accommodating chamber E311 at a predetermined position, the emitting antenna of the accommodating chamber E311 can be coupled with the receiving antenna (i.e., the power supply member 4) of the chip testing device 1, so that the external power supply apparatus can provide electricity to each of the testing modules 30.

Each of the temperature adjusting devices E34 is connected to the central control device E1, and is controllable by the central control device E1 so that an environment temperature of the chips C on the electrical connection sockets 2 of the chip testing device 1 in the corresponding accommodating chamber E311 is at a predetermined temperature.

In an embodiment of the present disclosure, the temperature adjusting devices E34 can be divided into a plurality of heating devices E34A and a plurality of cooling devices E34B. The heating devices E34A and the cooling devices E34B are arranged in the apparatus body E31. The inner temperature of each of the accommodating chambers E311 can be changed by one of the heating devices E34A or one of the cooling devices E34B for reaching the predetermined high temperature or the predetermined low temperature.

Each of the heating devices E34A has a high temperature contacting structure E34A1 that is configured to contact one side of the chips C on the chip testing device 1. Each of the heating devices E34A is connected to the central control device E1. Each of the heating devices E34A is controllable by the central control device E1 to independently operate the high temperature contacting structure E34A1 and to increase a temperature of the high temperature contacting structure E34A1 to reach the predetermined high temperature. The material of the high temperature contacting structure E34A1 is determined according to the predetermined high temperature. A side of the high temperature contacting structure E34A1 contacting the side of the chips C can be flat.

In a practical application, each of the high temperature contacting structures E34A1 can include an electric heater (e.g., a heating coil) or a plurality of fluid channels that provide a high temperature fluid to flow there-through. Moreover, the electric heater or a heater having the fluid channels can be disposed one side of the high temperature contacting structure E34A1.

Each of the cooling devices E34B has a low temperature contacting structure E34B1 that is configured to contact one side of the chips C on the chip testing device 1. Each of the cooling devices E34B is connected to the central control device E1. Each of the cooling devices E34B is controllable by the central control device E1 to independently operate the low temperature contacting structure E34B1 and to decrease a temperature of the low temperature contacting structure E34B1 to reach the predetermined low temperature. The material of the low temperature contacting structure E34B1 is determined according to the predetermined high temperature. A side of the low temperature contacting structure E34B1 contacting the side of the chips C can be flat. In a practical application, each of the low temperature contacting structures E34B1 can include a plurality of fluid channels that provide a low temperature fluid to flow there-through. Moreover, a component having the fluid channels can be disposed one side of the low temperature contacting structure E34B1.

In the above embodiment, each of the heating devices E34A has the high temperature contacting structure E34A1, and each of the cooling devices E34B has the low temperature contacting structure E34B1. Moreover, the heating device E34A and the cooling device E34B are configured to transmit or absorb heat to each of the chips C by using the high temperature contacting structure E34A1 and low temperature contacting structure E34B1 to directly contact the side of the chips C, so that the chips C can have the predetermined temperature. However, in other embodiments of the present disclosure, each of the heating devices E34A and each of the cooling devices E34B can allow the environment temperature of the chips C to reach the predetermined temperature without contacting the chips C. For example, each of the heating devices E34A or each of the cooling devices E34B can be provided to increase or decrease the inner temperature of the corresponding accommodating chamber E311.

In the above description, each of the accommodating chambers E311 can be provided with the heating device E34A or the cooling device E34B therein, but the each of the temperature adjusting devices E34 in the corresponding accommodating chamber E311 is not limited to only have a heating function or a cooling function. In other embodiments of the present disclosure, each of the temperature adjusting devices E34 can include a heater E341 and a cooler E342, and can further include a contacting structure E343 according to design requirements. The heater E341 and the cooler E342 are controllable by the central control device E1 so that a temperature of the contacting structure E343 is at the predetermined high temperature or the predetermined low temperature. The contacting structure E343 is configured to contact the chips C on the chip testing device 1, so that the chips C can reach the predetermined temperature by being directly contacted with the contacting structure E343. In other embodiments of the present disclosure, each of the temperature adjusting devices E34 can be provided without the contacting structure E343, which allows the corresponding accommodating chamber E311 to have the predetermined high temperature or the predetermined low temperature through the heater E341 or the cooler E342.

As shown in FIG. 9 to FIG. 14, the temperature adjusting device E34 of each of the environment control apparatus E3 can be connected to a cover E35. The cover E35 has a concavity E351 formed on one side thereof. The cover E35 has an accommodating opening E352 in spatial communication with the concavity E351. The cover E35 further has two air suction holes E353. Each of the environment control apparatus E3 can include at least one air suction device E37, and the two air suction holes E353 are configured to connect to the air suction device E37.

The temperature adjusting device E34 can include the contacting structure E34A1, E34B1, or E343, and one side of the contacting structure E34A1, E34B1, or E343 can be flat. The contacting structure E34A1, E34B1, or E343 can include at least one fluid channel E344, a fluid entrance E345, and a fluid exit E346, the latter two of which correspond in position to the fluid channel E344. A high temperature fluid or a low temperature fluid can flow into the fluid channel E344 through the fluid entrance E345, and can flow out of the fluid channel E344 through the fluid exit E346. Since the high temperature fluid or the low temperature fluid continuously flows in the fluid channel E344, the temperature of the contacting structure E34A1, E34B1, or E343 can be reached at the predetermined temperature.

In a practical application, the cover E35 can be fixed with a lid E36, and the lid E36 and the temperature adjusting device E34 jointly define an accommodating space SP1 there-between that can be filled with any component having heat-insulation property.

Figure 14:
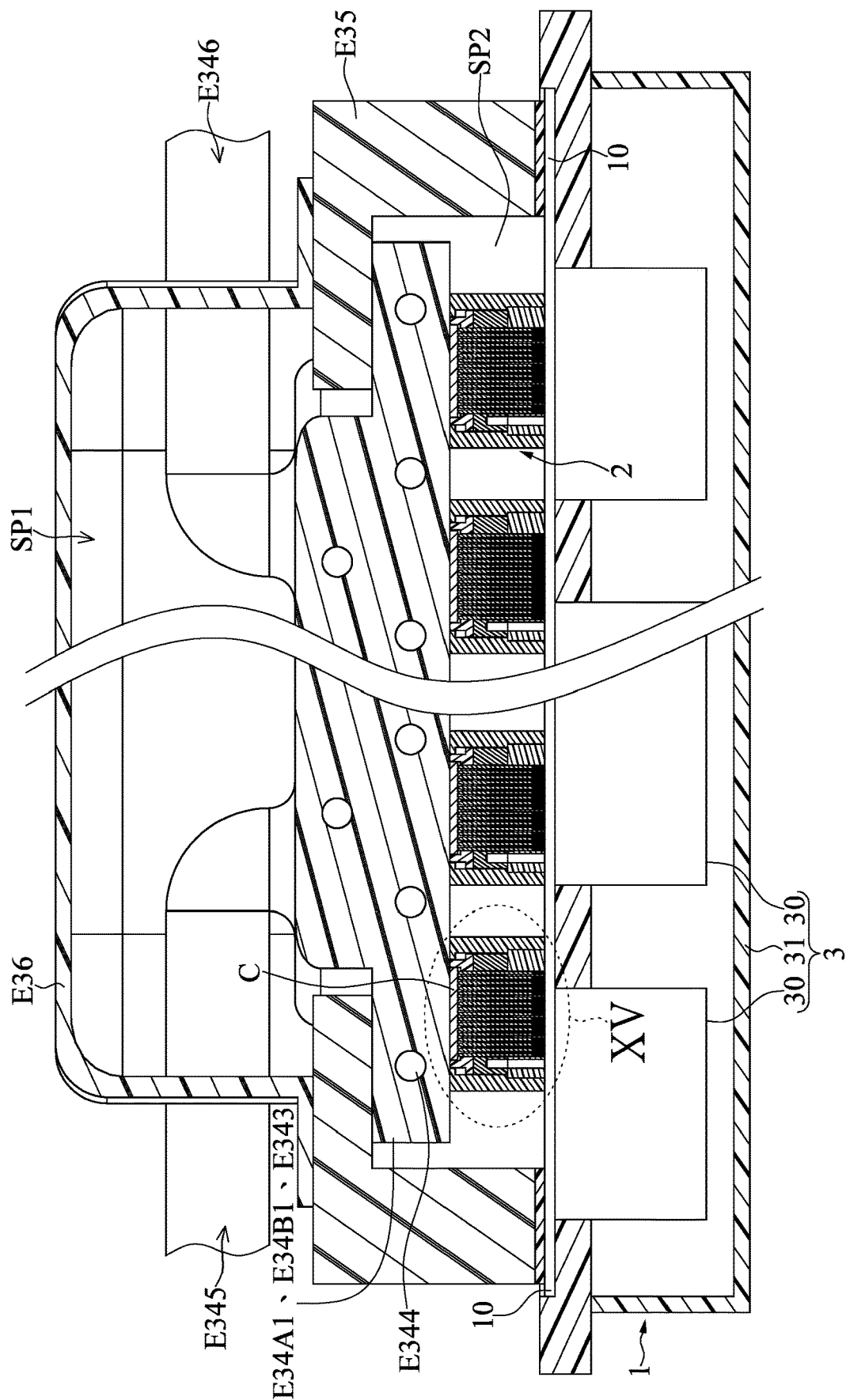
FIG. 14 is a cross-sectional view showing the temperature adjusting device and the cover both disposed on the chip testing device according to the present disclosure.
Figure 15:
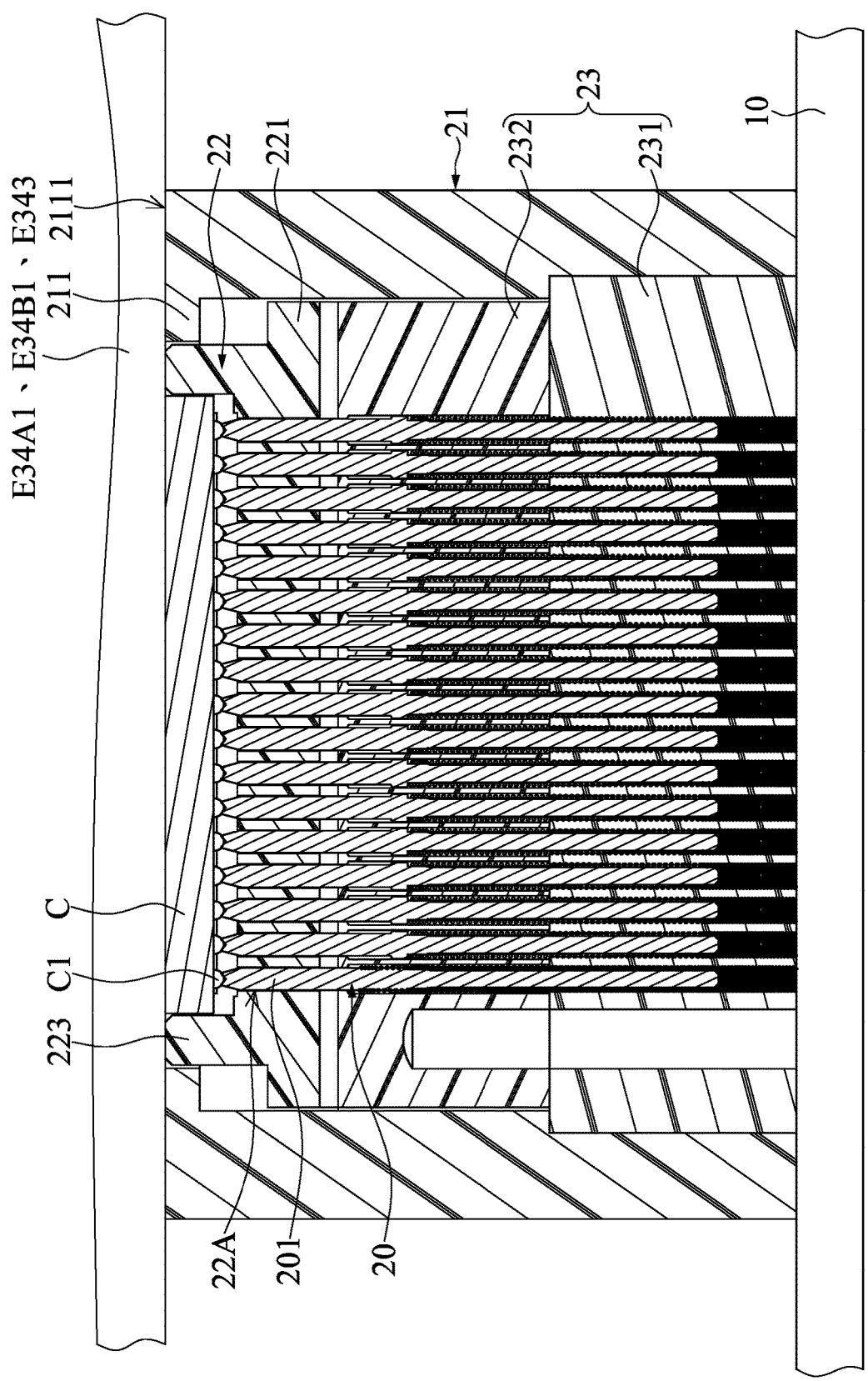
FIG. 15 is a partial enlarged view of FIG. 14.

As shown in FIG. 14 and FIG. 15, FIG. 14 is a cross-sectional view showing that the chips C on the electrical connection sockets 2 of the chip testing device 1 contact the contacting structure E34A1, E34B1, or E343 of the temperature adjusting device E34, and FIG. 15 is an enlarged view of portion XV of FIG. 14. When the cover E35 is abutted against the circuit board 10, the cover E35, the contacting structure E34A1, E34B1, or E343, and the circuit board 10 jointly define an enclosed space SP2, the electrical connection sockets 2 are arranged in the enclosed space SP2, and the connection terminals of the power supply member 4 can contact the corresponding chamber terminals E33.

As shown in FIG. 8 and FIG. 15, when the central control device E1 controls the air suction apparatus to suction away air in the enclosed space SP2 through the air suction holes E353 of the cover E35 so that the enclosed space SP2 is in a substantial vacuum state, the contacting structure E34A1, E34B1, or E343 would be abutted against the lift structure 22 of each of the electrical connection sockets 2, each of the lift structures 22 is moved toward the circuit board 10 relative to the corresponding socket body 21, the probe assemblies 20 are in contact with the electrical connection portions C1 of the corresponding chip C, and the contacting structure E34A1, E34B1, or E343 is abutted against the side of the chips C. In other words, when the air of the enclosed space SP2 is expelled, the contacting structure E34A1, E34B1, or E343 would be abutted against the lift structure 22 of each of the electrical connection sockets 2, and the lift structure 22 of each of the electrical connection sockets 2 is moved from a position shown in FIG. 8 to a position shown in FIG. 15.

In a practical application, the central control device E1 can control the air suction apparatus to suction away the air of the enclosed space SP2 at a predetermined condition that is determined according to design requirements. For example, the condition can be one of the following conditions. The connection terminals of the power supply member 4 (as shown in FIG. 3) and the chamber terminals E33 (as shown in FIG. 10) are connected to each other. The chip testing device 1 disposed in the accommodating chamber E311 at the predetermined position is detected by at least one sensor (e.g., an optical sensor or a mechanical compression sensor) that is arranged in the accommodating chamber E311 (as shown in FIG. 9).

As shown in FIG. 10 and FIG. 15, when the air of the enclosed space SP2 is expelled by the air suction device E37, the contacting structure E34A1, E34B1, or E343 is abutted against the side of the chips C, and the probe assemblies 20 of each of the electrical connection socket 2 are connected to the electrical connection portions C1 of the corresponding chip C, the central control device E1 can control the temperature adjusting device E34 to be operated, so that the contacting structure E34A1, E34B1, or E343 can have the predetermined temperature. Specifically, when the contacting structure E34A1, E34B1, or E343 has the predetermined temperature, the central control device E1 can control the testing modules 30 connected to the electrical connection sockets 2 to perform the predetermined testing process on the chips.

The cooperation of the cover E35 and the air suction device E37 can effectively reduce a force for causing the contacting structure E34A1, E34B1, or E343 to abut against the lift structures 22 of the electrical connection sockets 2. In other words, cooperation of the cover E35 and the air suction device E37 can effectively reduce a force for causing the chips C of the chip testing device 1 to abut against the contacting structure E34A1, E34B1, or E343 by a lift device E38.

As shown in FIG. 1 and FIG. 2, the transferring apparatus E4 is disposed among the environment control apparatuses E3, and is configured to transfer the chip testing device 1. The transferring apparatus E4 can include a robotic arm and a retaining assembly that is configured to retain the chip testing device 1. The central control device E1 is connected to the transferring apparatus E4, and can control the transferring apparatus E4 to transfer the chip testing device 1 carrying the chips C into any one of the accommodating chambers E311 of any one of the environment control apparatuses E3 (shown in FIG. 9). Moreover, the transferring apparatus E4 can be controlled by the central control device E1 so as to transfer the chip testing device 1 out of the corresponding accommodating chamber E311.

The classification apparatus E5 is connected to the central control device E1, and is controllable by the central control device E1 to detach the chips C from the electrical connection sockets 2 of the chip testing device 1. Moreover, the classification apparatus E5 can place the chips C at a good product region A1 of a tray or a defective product region A2 of a tray according to test results of the chips C from the predetermined testing process. The classification apparatus E5 can include a robotic arm. In an embodiment of the present disclosure, the classification apparatus E5 and the chip mounting apparatus E2 are arranged adjacent to each other, and are configured to share the same robotic arm. In a practical application, the good product region A1 can be divided into a plurality of sub-regions according to design requirements, and the classification apparatus E5 can place the chips C at different sub-regions of the good product region A1 according to the test results of the chips C from the predetermined testing process. For example, the chips C can be classified according to working performance thereof.

Figure 16:
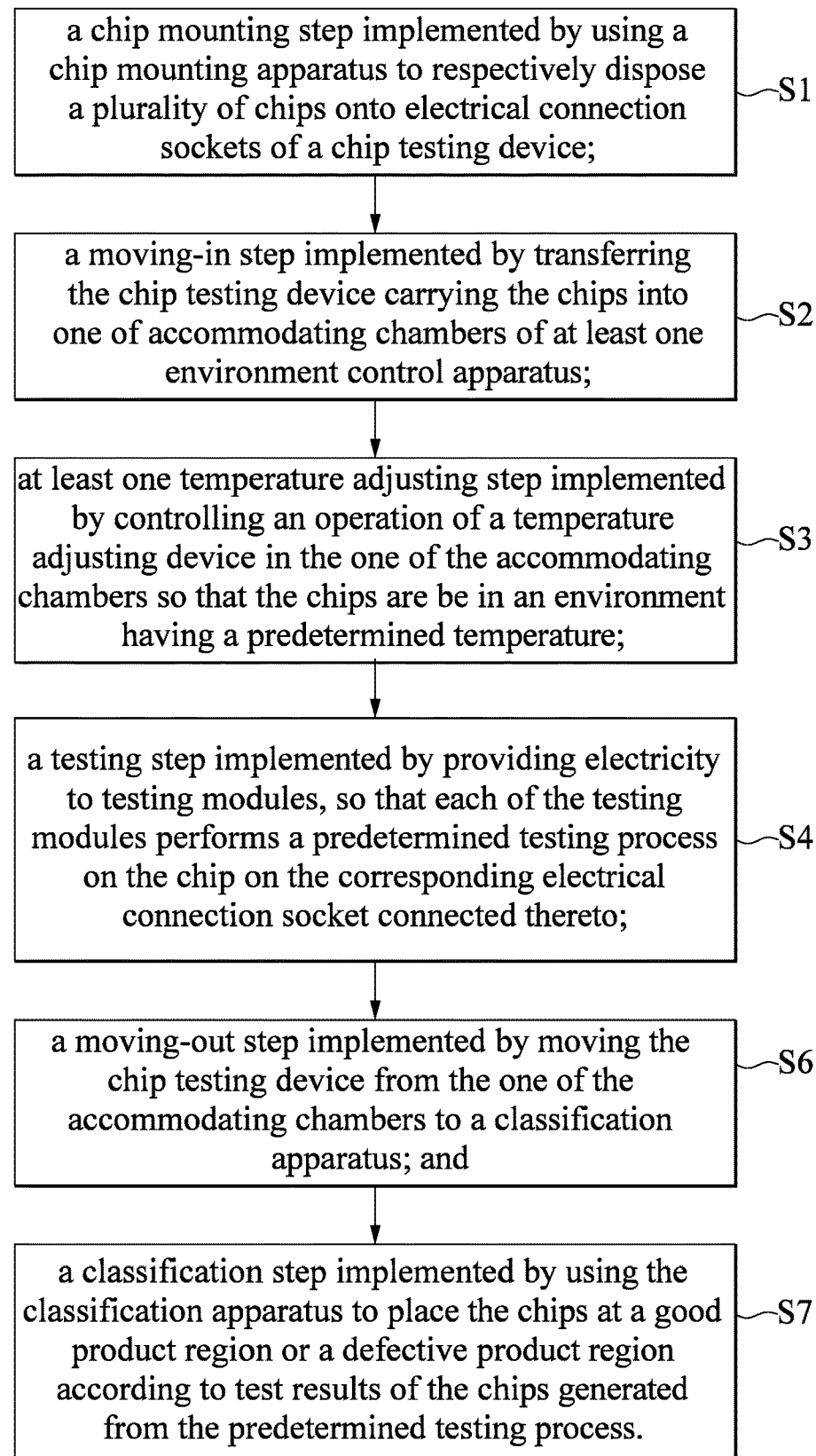
FIG. 16 is a flow chart showing a chip testing method that is implemented by using the chip testing system according to a first embodiment of the present disclosure.

FIG. 16 is a flow chart of a chip testing method according to a first embodiment of the present disclosure. The chip testing system E can perform the predetermined testing process on the chips C by implementing the following chip testing method. The chip testing method includes: a chip mounting step S1 implemented by using the chip mounting apparatus E2 to respectively dispose a plurality of chips C from a tray onto the electrical connection sockets 2 of the chip testing device 1; a moving-in step S2 implemented by transferring the chip testing device 1 carrying the chips C into one of the accommodating chambers E311 of one of the environment control apparatuses E3; a temperature adjusting step S3 implemented by controlling an operation of the temperature adjusting device E34 in the one of the accommodating chambers E311 so that the chips C are in an environment having a predetermined temperature; a testing step S4 implemented by providing electricity to the chip testing device 1 in the one of the accommodating chambers E311, so that each of the testing modules 30 performs a predetermined testing process on the corresponding chip C connected thereto; a moving-out step S6 implemented by moving the chip testing device 1 from the one of the accommodating chambers E311 to the classification apparatus E5; and a classification step S7 implemented by using the classification apparatus E5 to place the chips C at a good product region A1 or a defective product region A2 according to test results of the chips C generated from the predetermined testing process.

In an embodiment of the present disclosure, the power supply member 4 of the chip testing device 1 includes the connection terminals, and the chip testing method includes a connecting step before the testing step S4. Moreover, the connecting step is implemented by connecting the connection terminals of the power supply member 4 of the chip testing device 1 to the chamber terminals E33 of the one of the accommodating chambers E311. Specifically, the connecting step can be implemented between the moving-in step S2 and the temperature adjusting step S3, or between the temperature adjusting step S3 and the testing step S4.

Figure 17:
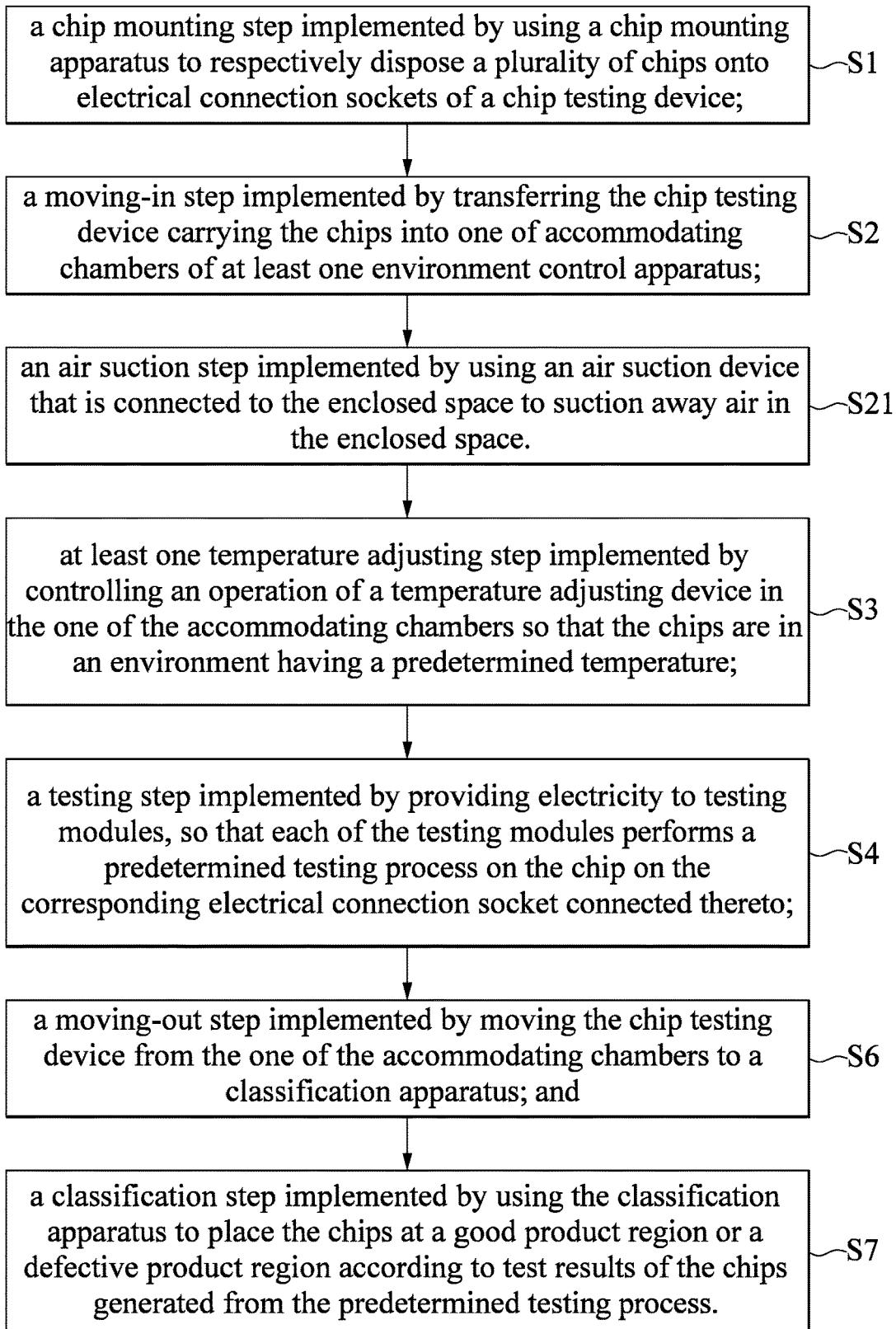
FIG. 17 is a flow chart showing a chip testing method that is implemented by using the chip testing system according to a second embodiment of the present disclosure.

FIG. 17 is a flow chart of a chip testing method according to a second embodiment of the present disclosure. The chip testing method in the present embodiment further includes an air suction step S21 that is between the moving-in step S2 and the temperature adjusting step S3 and is not disclosed in the first embodiment. Moreover, in the moving-in step S2, the cover E35 of the one of the accommodating chambers E311 is connected to the circuit board 10, so that the cover E35 and the circuit board 10 jointly define an enclosed space SP2 (shown in FIG. 14). After that, the air suction step S21 is implemented by using an air suction device that is connected to the enclosed space SP2 to suction away air in the enclosed space SP2.

As shown in FIG. 14, when the cover E35 and the circuit board 10 jointly define the enclosed space SP2, the electrical connection sockets 2 are arranged in the enclosed space SP2. After the air suction step S21 is implemented, each of the electrical connection sockets 2 is arranged in a substantial vacuum environment. Accordingly, in the implementation of the temperature adjusting step S3, the temperature of the enclosed space SP2 is not easily affected by an external environment, and an environment temperature of the chips C on the electrical connection sockets 2 would be easy to maintain at a predetermined temperature.

Figure 18:
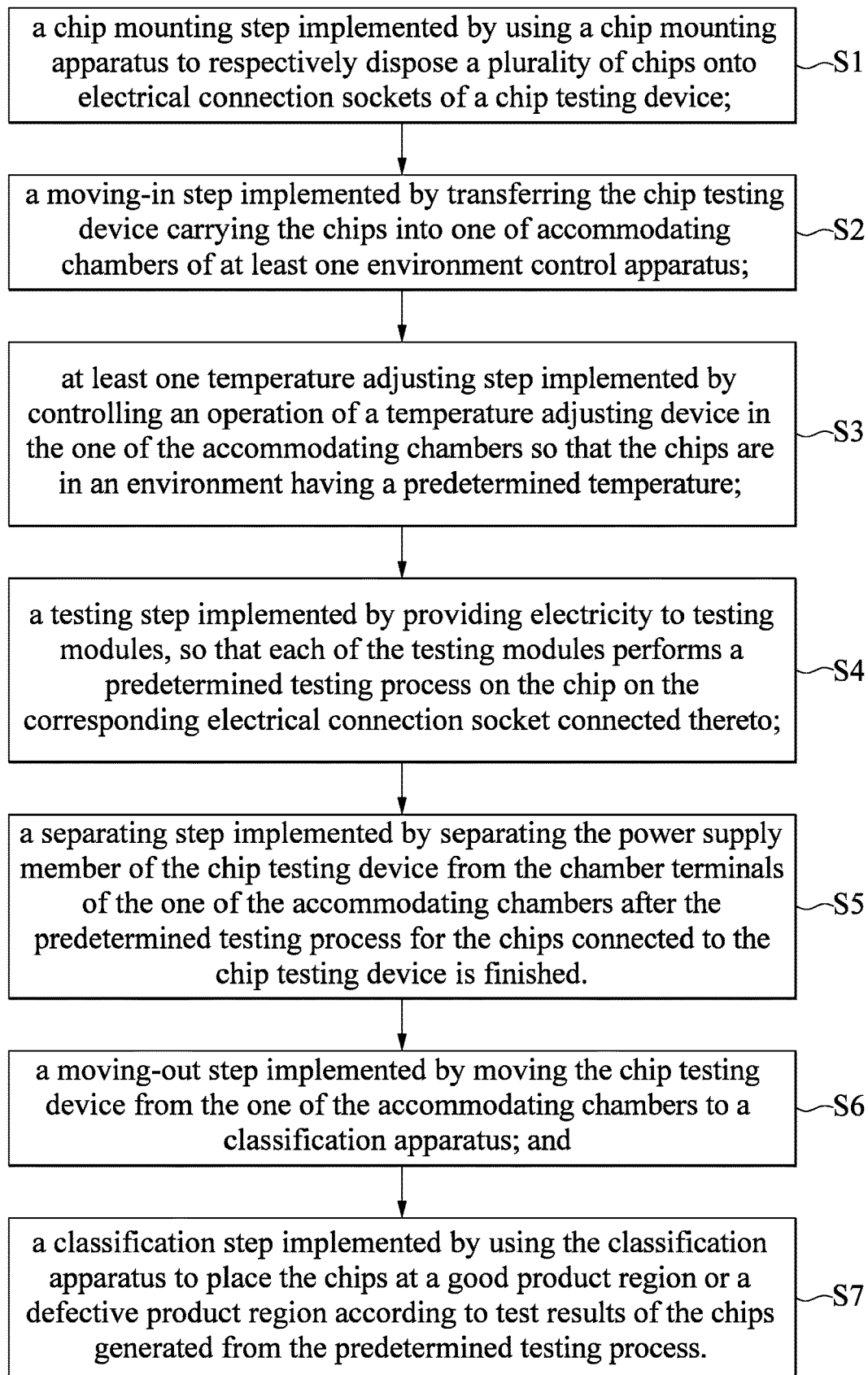
FIG. 18 is a flow chart showing a chip testing method that is implemented by using the chip testing system according to a third embodiment of the present disclosure.

FIG. 18 is a flow chart of a chip testing method according to a third embodiment of the present disclosure. The chip testing method in the present embodiment further includes a separating step S5 that is between the testing step S4 and the moving-out step S6 and is not disclosed in the above embodiments. Moreover, the separating step S5 is implemented by separating the power supply member 4 of the chip testing device 1 from the chamber terminals E33 of the one of the accommodating chambers E311 after the predetermined testing process for the chips C connected to the chip testing device 1 is finished.

As shown in FIG. 3, FIG. 9, and FIG. 10, the environment control apparatus E3 further includes a plurality of lift devices E38, and each of the accommodating chambers E311 is provided with one of the lift devices E38 therein. Each of the lift devices E38 is connected to the central control device E1. Each of the lift devices E38 is controllable by the central control device E1 to move the chip testing device 1 in the corresponding accommodating chamber E311, so that the connection terminals of the power supply member 4 of the chip testing device 1 can be contacted with or separated from the corresponding chamber terminals E33.

In a practical application, when the chip testing device 1 is transferred into the accommodating chamber E311 by the transferring apparatus E4, the power supply members 4 of the chip testing device 1 can be not in contact with the corresponding chamber terminals E33. Moreover, when any one of the accommodating chambers E311 receiving the chip testing device 1 is detected by the central control device E1, the central control device E1 can control the corresponding lift device E38 to move the chip testing device 1 in the corresponding accommodating chamber E311, so that the connection terminals of the power supply member 4 can be contacted with the corresponding chamber terminals E33. Accordingly, an external power supply apparatus can provide electricity to the testing modules 30 through the power supply member 4.

In a practical application, the detection manner of the central control device E1 for determining whether any one of the accommodating chambers E311 receives the chip testing device 1 can be changed according to design requirements, and is not limited thereto. For example, the accommodating chamber E311 can be provided with a sensor (e.g., an optical sensor or a mechanical compression sensor) therein, and when the chip testing device 1 is placed into the accommodating chamber E311, the sensor transmits a related signal to the central control device E1, so that the central control device E1 can determine whether the accommodating chamber E311 receives the chip testing device 1 according to the signal from the sensor. The sensor can be used to detect whether the chip testing device 1 is at a predetermined position in the accommodating chamber E311. Specifically, the sensor can transmit a signal to the central control device 1 according to the position of the chip testing device 1 in the accommodating chamber E311, and the central control device 1 can determine whether the chip testing device 1 is at a predetermined position in the accommodating chamber E311 according to the signal from the sensor. Moreover, if the central control device 1 determines that the chip testing device 1 is at a predetermined position in the accommodating chamber E311, the central control device 1 can control the lift device E38 to move. If the central control device 1 determines that the chip testing device 1 is not at the predetermined position in the accommodating chamber E311, the central control device 1 can control an alert device to warn a user. For example, the central control device 1 can control an alerting light to emit light in a specific color, or can control a screen to show an error signal.

In an embodiment of the present disclosure, the power supply member 4 is the receiving antenna, and when the chip testing device 1 is disposed in the accommodating chamber E311, the emitting antenna in the accommodating chamber E311 can be provided to couple with the receiving antenna, so that the chip testing device 1 can receive electricity through the power supply member 4. In an embodiment of the present disclosure, only if the chip testing device 1 is at the predetermined position in the accommodating chamber E311, can the receiving antenna be coupled with the receiving antenna, but the present disclosure is not limited thereto.

As shown in FIG. 3 and FIG. 10, each of the temperature adjusting devices E34 has the contacting structure E34A1, E34B1, or E343, and when the lift device E38 is controlled to move, the chip testing device 1 and the chips disposed thereon are moved toward or away from the contacting structure E34A1, E34B1, or E343 by the lift device E38.

In an embodiment of the present disclosure, the temperature adjusting device E34 is connected to the cover E35, and when the lift device E38 is controlled to move the chip testing device 1 toward the contacting structure E34A1, E34B1, or E343 until arriving at the predetermined position, the cover E35 is disposed on the circuit board 10 of the chip testing device 1 so as to jointly define the enclosed space SP2. After that and before the temperature adjusting step S3, the central control device E1 controls the air suction device E37 to suction away the air in the enclosed space SP2 so that the enclosed space SP2 is in a substantial vacuum state. After the temperature adjusting step S3, the temperature of the enclosed space SP2 is not easily affected by an external environment.

In a practical application, when the chip testing device 1 is disposed in the accommodating chamber E311, and the lift device E38 raises the chip testing device 1, the chips C can be not in contact with the contacting structure E34A1, E34B1, or E343. Moreover, when the air suction device E37 starts to perform an air suction operation, the chips C are in contact with the contacting structure E34A1, E34B1, or E343, but the present disclosure is not limited thereto. In other embodiments of the present disclosure, the chips C can be in contact with the contacting structure E34A1, E34B1, or E343 before the air suction device E37 starts to perform the air suction operation.

In the testing step S4, the chip testing device 1 is coupled or connected to the corresponding emitting antenna or the corresponding chamber terminals through the receiving antenna or the connection terminals, so that the chip testing device 1 can obtain electricity to allow each of the testing modules 30 to test the corresponding chip C.

As shown in FIG. 9 and FIG. 10, the environment control apparatus E3 can further include a plurality of retaining devices E39 arranged in the accommodating chambers E311 for firmly connecting the connection terminals of the power supply member 4 of the chip testing device 1 to the chamber terminals E33. Each of the retaining devices E39 is connected to the central control device E1, and is controllable by the central control device E1 so as to limit a range of movement of the chip testing device 1 in the corresponding accommodating chamber E311. The specific structure of the retaining device E39 can be formed according to design requirements. For example, in other embodiments of the present disclosure, the chip testing device 1 can be formed with an engaging hole, and the retaining device E39 can include a hook structure corresponding in shape to the engaging hole, so that when the retaining device E39 is in operation, the hook structure engages in the engaging hole. Or, the retaining device E39 can include a plurality of retractable pins that are arranged in the engaging hole of the chip testing device 1.

Moreover, in an embodiment of the present disclosure, each of the accommodating chambers E311 of each of the environment control apparatuses E3 is provided with the contacting structure E34A1, E34B1, or E343, the lift device E38, and the retaining device E39, and the moving-in step S2 of the chip testing method can include: a moving-in chamber step implemented by transferring the chip testing device 1 into one of the accommodating chambers E311; a lifting step implemented by controlling the lift device E38 of the one of the accommodating chambers E311 so as to move the chip testing device 1 toward the contacting structure E34A1, E34B1, or E343; and a locking step implemented by controlling the retaining structure E39 in the one of the accommodating chambers E311 so as to limit a range of movement of the chip testing device 1 in the one of the accommodating chambers E311.

In other words, the chip testing method of the present embodiment can be simply described as the following steps. A plurality of chips C are disposed onto the chip testing device 1; the chip testing device 1 carrying the chips C is moved into one of the accommodating chambers E311; the lift device E38 is controlled to lift the chip testing device 1, so that one side of the chips C is located adjacent to the contacting structure E34A1, E34B1, or E343 of the temperature adjusting device E34, and the cover E35 connected to the temperature adjusting device E34 is disposed on the circuit board 10 of the chip testing device 1 to jointly define an enclosed space SP2; and the air suction device E37 is controlled to suction away the air in the enclosed space Sp2, so that the side of the chips C is in contact with the contacting structure E34A1, E34B1, or E343, and the temperature adjusting device E34 is controlled at the same time so that the chips C are at the predetermined temperature. Moreover, when the temperature adjusting device E34 is operated, the chip testing device 1 receives electricity, so that the testing modules 30 are operated to test the chips C.

Figure 19:
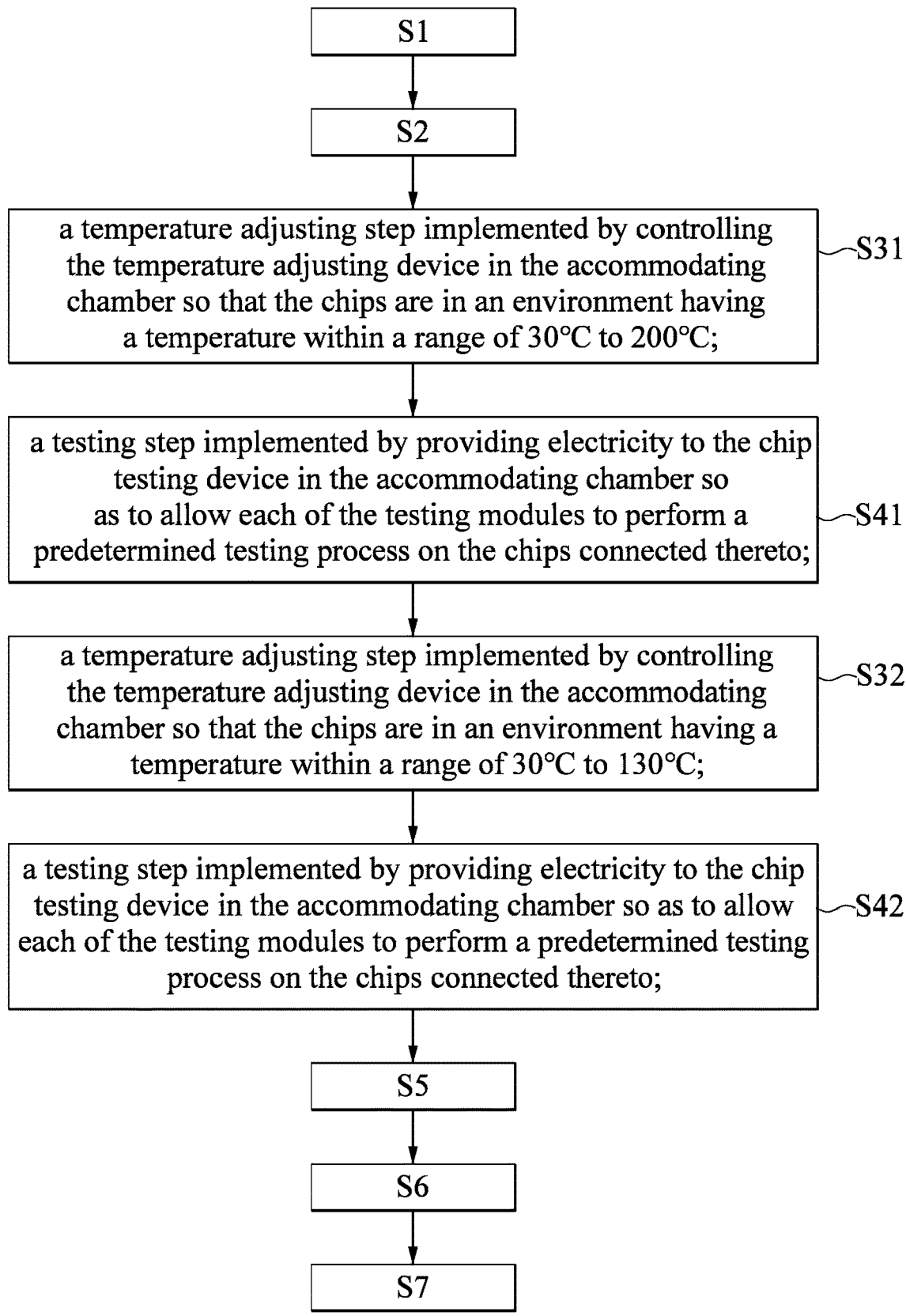
FIG. 19 is a flow chart showing a chip testing method that is implemented by using the chip testing system according to a fourth embodiment of the present disclosure.

FIG. 19 is a flow chart of a chip testing method according to a fourth embodiment of the present disclosure. The chip testing system E of the present embodiment is configured to test a plurality of memory chips (i.e., the chips C) by implementing the chip testing method. The difference between the chip testing method in the present embodiment and other embodiments of the present disclosure is described as follows. In the present embodiment, the temperature adjusting step S3 and the testing step S4 can be repeatedly implemented for two times after the moving-in step S2 and before the moving-out step S5, and include a temperature adjusting step S31, a testing step S41, a temperature adjusting step S32, and a testing step S42.

In the temperature adjusting step S31 and the testing step S41 (i.e., the temperature adjusting step S3 and the testing step S4 are implemented for a first time of the two times), the temperature adjusting device E34 in the accommodating chamber E311 is controlled so that the chips C are in an environment having a temperature within a range of 30° C. to 200° C. and are tested by the testing modules 30 with at least one of a reading test, a writing test, and an electrical property test. The temperature adjusting step S31 and the testing step S41 in the present embodiment can be regarded as a burn-in test for the memory chips.

In the temperature adjusting step S32 and the testing step S42 (i.e., the temperature adjusting step S3 and the testing step S4 are implemented for a second time of the two times), the temperature adjusting device E34 of the accommodating chamber E311 is controlled so that the chips C are in an environment having a temperature within a range of 30° C. to 130° C. and are tested by the testing modules 30 with at least one of a reading test, a writing test, and an electrical property test. The temperature adjusting step S32 and the testing step S42 in the present embodiment can be regarded as a high temperature test for the memory chips.

It should be noted that the chip testing method in other embodiments of the present disclosure can further include a moving-in step and a moving-out step between the testing step S41 and the temperature adjusting step S32. Specifically, the moving-in step is implemented by moving the chip testing device 1 from the corresponding accommodating chamber E311, and the moving-out step is implemented by moving the chip testing device 1 into another one of the accommodating chambers E311. In other words, the chip testing device 1 can be tested in two of the accommodating chambers E311 that have different temperatures (one of the different temperatures is within a range of 30° C. to 200° C. and the other one of the different temperatures is within a range of 30° C. to 130° C.), and the two of the accommodating chambers E311 can be arranged in the same environment control apparatus E3 or can be respectively arranged in two of the environment control apparatuses E3.

Figure 20:
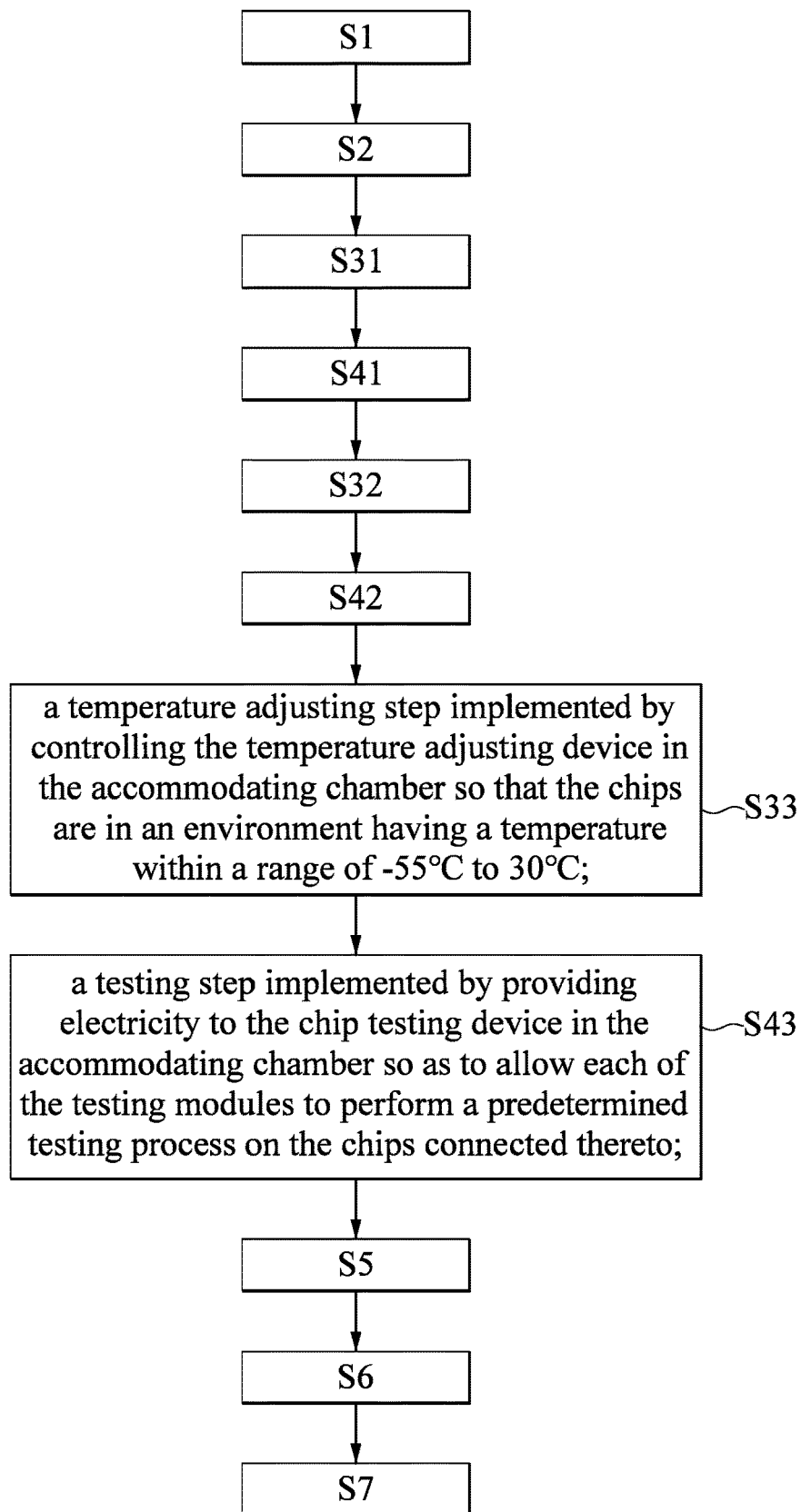
FIG. 20 is a flow chart showing a chip testing method that is implemented by using the chip testing system according to a fifth embodiment of the present disclosure.

FIG. 20 is a flow chart of a chip testing method according to a fifth embodiment of the present disclosure. The chip testing system E of the present embodiment is configured to test a plurality of memory chips (i.e., the chips C) by implementing the chip testing method. The difference between the chip testing method in the present embodiment and the fourth embodiment shown in FIG. 19 is described as follows. In the present embodiment, the temperature adjusting step S3 and the testing step S4 can be repeatedly implemented for three times after the moving-in step S2 and before the moving-out step S5, and include a temperature adjusting step S31, a testing step S41, a temperature adjusting step S32, a testing step S42, a temperature adjusting step S33, and a testing step S43.

After the temperature adjusting step S32 and the testing step S42 are implemented, the temperature adjusting step S33 and the testing step S43 (i.e., the temperature adjusting step S3 and the testing step S4 are implemented for a third time of the three times) are implemented by controlling the temperature adjusting device E34 in the accommodating chamber E311 so that the chips C are in an environment having a temperature within a range of −55° C. to 30° C. and are tested by the testing modules 30 with at least one of a reading test, a writing test, and an electrical property test. In other words, the chip testing method in the present embodiment is sequentially implemented by a burn-in test, a high temperature test, and a low temperature test for the memory chips.

Figure 21:
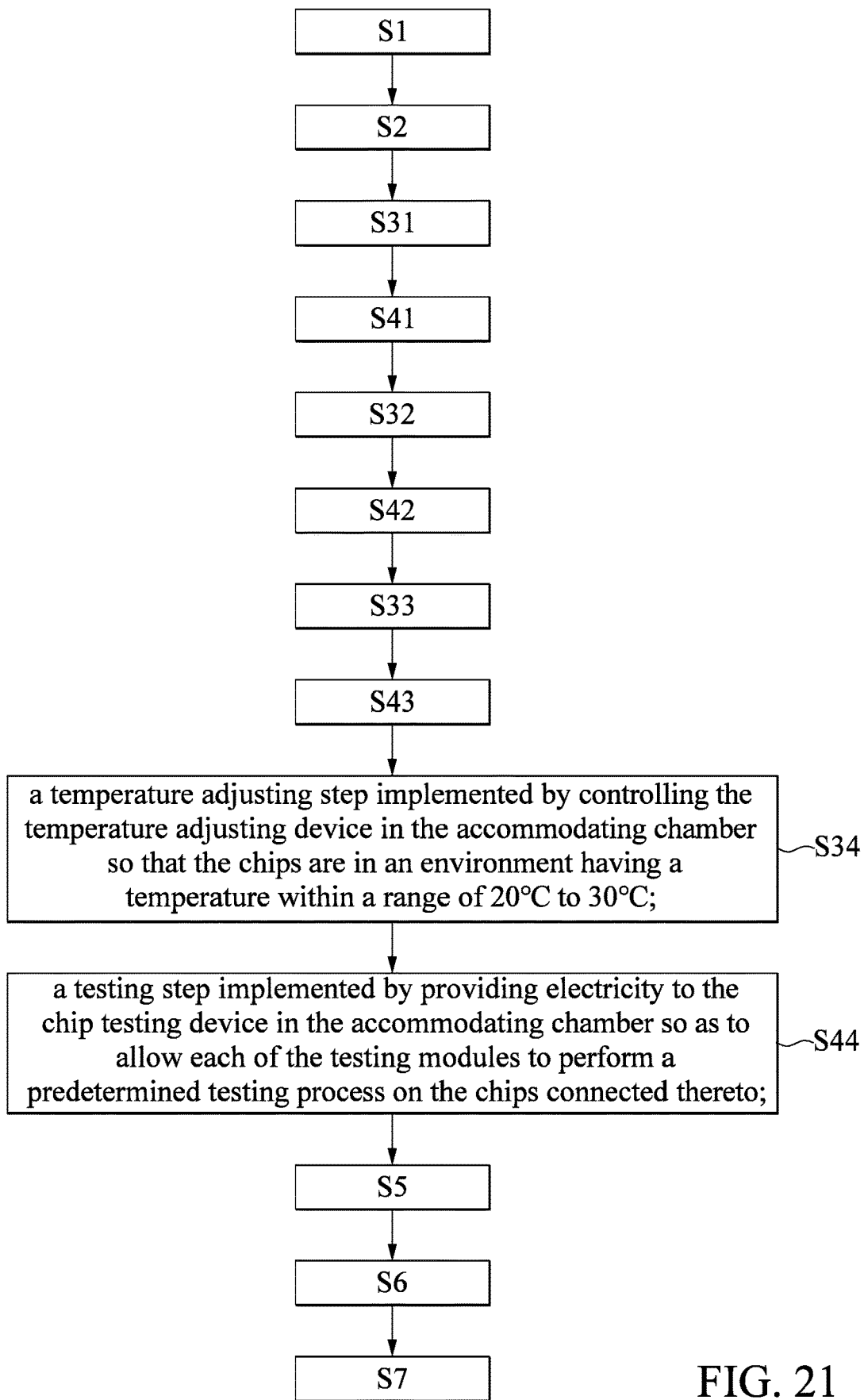
FIG. 21 is a flow chart showing a chip testing method that is implemented by using the chip testing system according to a sixth embodiment of the present disclosure.

FIG. 21 is a flow chart of a chip testing method according to a sixth embodiment of the present disclosure. The chip testing system E of the present embodiment is configured to test a plurality of memory chips (i.e., the chips C) by implementing the chip testing method. The difference between the chip testing method in the present embodiment and the fourth embodiment shown in FIG. 19 is described as follows. In the present embodiment, the temperature adjusting step S3 and the testing step S4 can be repeatedly implemented for four times after the moving-in step S2 and before the moving-out step S5, and include a temperature adjusting step S31, a testing step S41, a temperature adjusting step S32, a testing step S42, a temperature adjusting step S33, a testing step S43, a temperature adjusting step S34, and a testing step S44.

After the temperature adjusting step S33 and the testing step S43 are implemented, the temperature adjusting step S34 and the testing step S44 (i.e., the temperature adjusting step S3 and the testing step S4 are implemented for a fourth time of the four times) are implemented by controlling the temperature adjusting device E34 in the accommodating chamber E311 so that the chips C are in an environment having a temperature (e.g., an ambient temperature) within a range of 20° C. to 30° C. and are tested by the testing modules 30 with at least one of a reading test, a writing test, and an electrical property test. In other words, the chip testing method in the present embodiment is sequentially implemented by a burn-in test, a high temperature test, a low temperature test, and a normal temperature for the memory chips.

In summary, each of the temperature adjusting device E34 of each of the environment control apparatus E3 of the chip testing system E are provided with the cooler E342 and the heater E341 to implement the chip testing method of the above embodiments. Specifically, the chip testing device 1 can be moved into the accommodating chambers E311 of the environment control apparatus E3 so as to be sequentially in the different environments having different temperatures (e.g., a temperature within a range of 30° C. to 200° C., a temperature within a range of 30° C. to 130° C., a temperature within a range of −55° C. to 30° C., and a temperature within a range of 20° C. to 30° C.) and be tested with at least one of a reading test, a writing test, and an electrical property test. In other words, the chips C can be sequentially tested by a burn-in test, a high temperature test, a low temperature test, and a normal temperature. In a practical application, the sequence of the burn-in test, the high temperature test, the low temperature test, and the normal temperature can be adjusted according design requirements.

Figure 22:
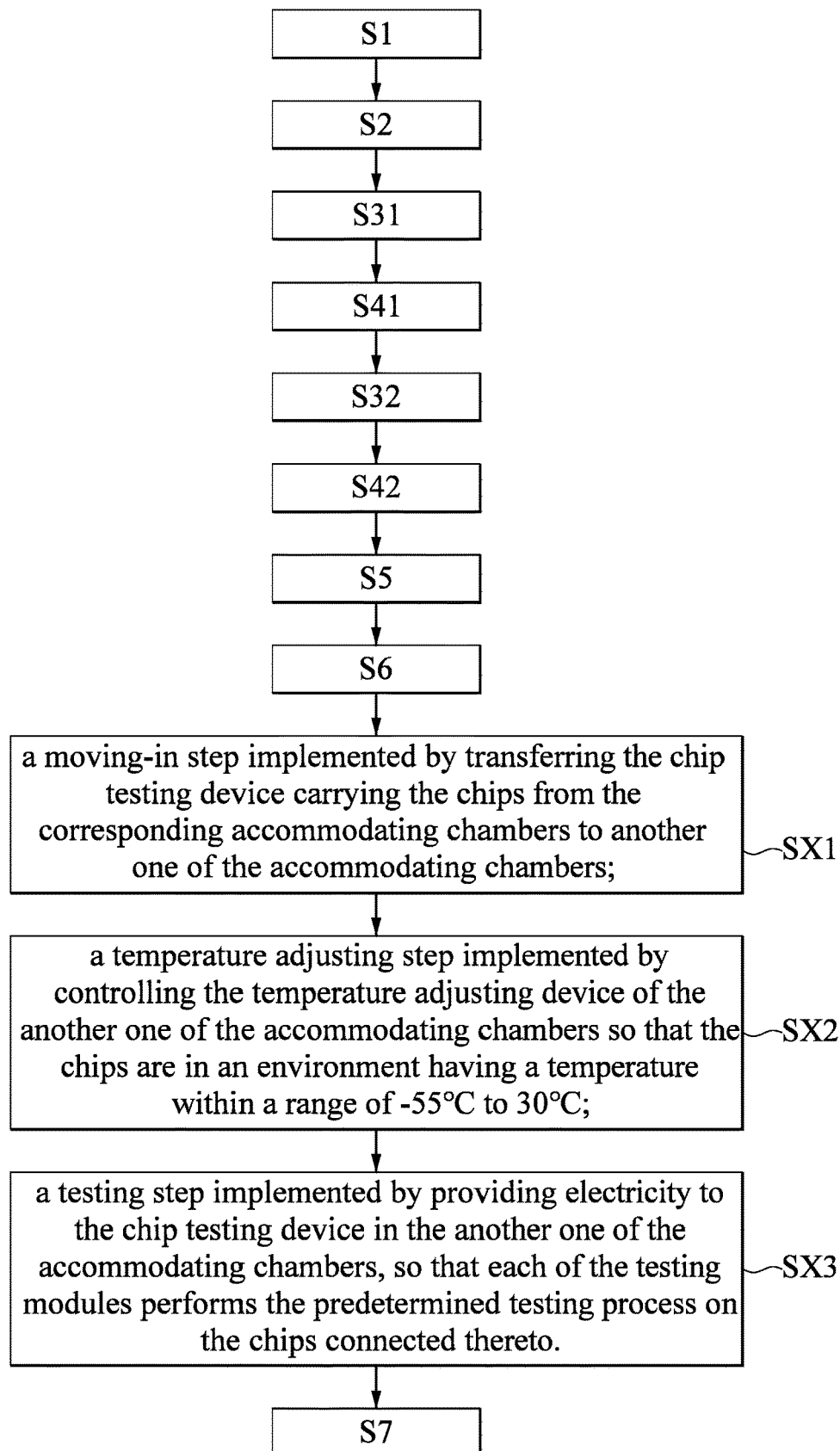
FIG. 22 is a flow chart showing a chip testing method that is implemented by using the chip testing system according to a seventh embodiment of the present disclosure.

FIG. 22 is a flow chart of a chip testing method according to a seventh embodiment of the present disclosure. The chip testing system E of the present embodiment is configured to test a plurality of memory chips (i.e., the chips C) by implementing the chip testing method. The difference between the chip testing method in the present embodiment and the fourth embodiment shown in FIG. 19 is described as follows. In the present embodiment, the chip testing method further includes the steps between the moving-out step S6 and the classification step S7 as follows: a moving-in step SX1 implemented by transferring the chip testing device 1 carrying the chips C from the corresponding accommodating chambers E311 to another one of the accommodating chambers E311; a temperature adjusting step SX2 implemented by controlling the temperature adjusting device E34 of the another one of the accommodating chambers E311 so that the chips C to be in an environment having a temperature within a range of −55° C. to 30° C.; and a testing step SX3 implemented by providing electricity to the chip testing device 1 in the another one of the accommodating chambers E311, so that each of the testing modules 30 performs the predetermined testing process on the chips C connected thereto.

In the chip testing method of the present embodiment, the chip testing device 1 is in one of the accommodating chambers E311 of the environment control apparatus E3 so that the chips C are sequentially in an environment having a temperature within a range of 30° C. to 200° C. and an environment having a temperature within a range of 30° C. to 130° C. and are tested by the testing modules 30 with at least one of a reading test, a writing test, and an electrical property test. After that, the chip testing device 1 is transferred from the one of the accommodating chambers E311 into another one of the accommodating chambers E311, and the two of the accommodating chambers E311 can be arranged in the same environment control apparatus E3 or can be respectively arranged in two of the environment control apparatuses E3. Finally, the temperature adjusting device E34 in the corresponding accommodating chamber E311 is operated so that the chips C on the chip testing device 1 are in an environment having a temperature within a range of −55° C. to 30° C. and are tested by the testing modules 30 with at least one of a reading test, a writing test, and an electrical property test.

The chip testing method of the present embodiment is implemented by the chip testing system E, and each of the accommodating chambers E311 of each of the environment control apparatuses E3 of the chip testing system E is particularly provided with one of the heating device E34A or the cooling device E34B.

In the chip testing method of the present embodiment, the temperature of any one of the accommodating chambers E311 does not change from a temperature more than 100° C. to a temperature less than 0° C., so that a total time for changing an environment temperature of the chips C to the predetermined high temperature or the predetermined low temperature can be effectively reduced, and a total energy provided by each of the temperature adjusting devices E34 for increasing the temperature of the corresponding accommodating chamber E311 to the predetermined temperature can be effectively reduced.

Figure 23:
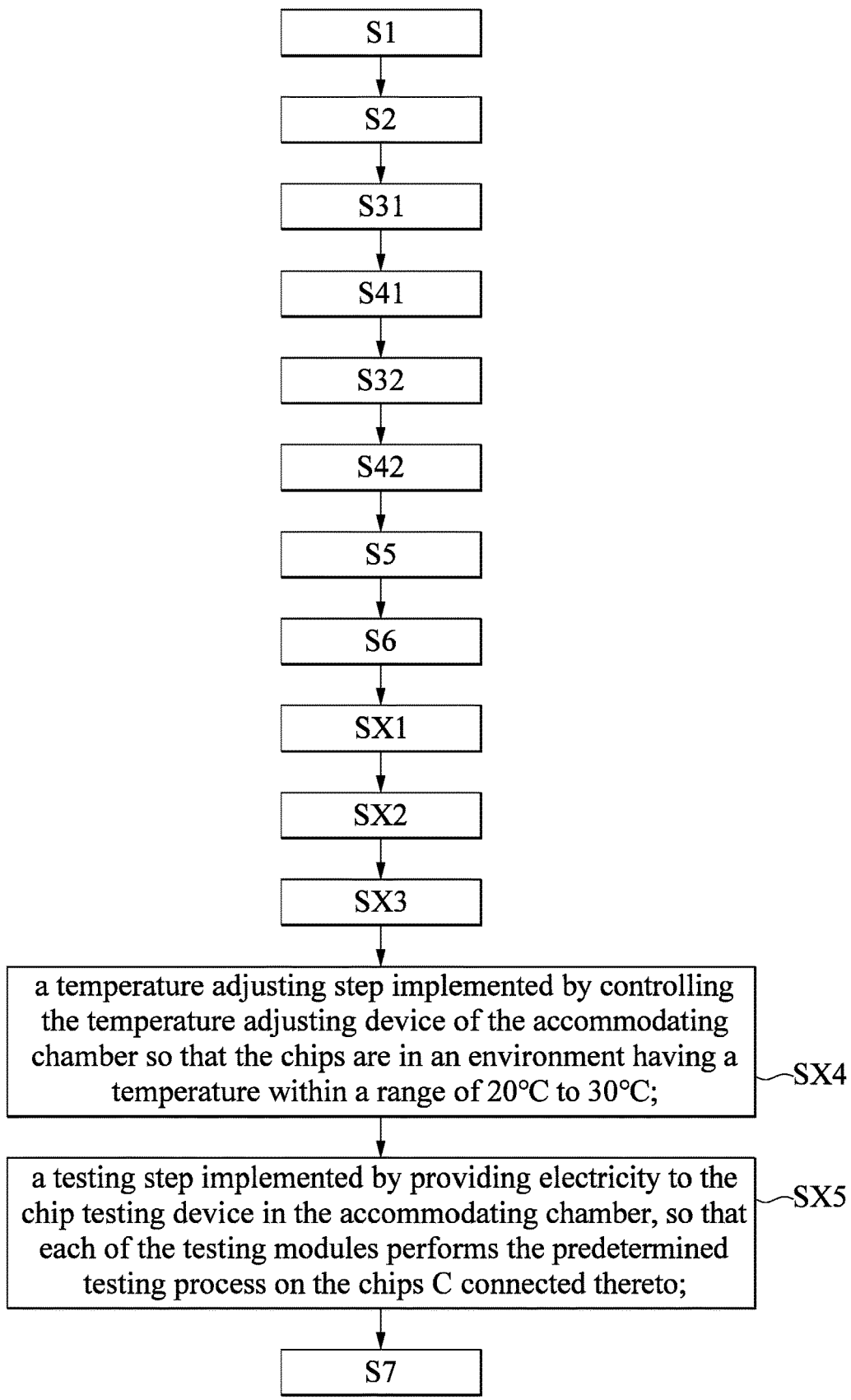
FIG. 23 is a flow chart showing a chip testing method that is implemented by using the chip testing system according to an eighth embodiment of the present disclosure.

FIG. 23 is a flow chart of a chip testing method according to an eighth embodiment of the present disclosure. The chip testing system E of the present embodiment is configured to test a plurality of memory chips (i.e., the chips C) by implementing the chip testing method. The difference between the chip testing method in the present embodiment and the above embodiments of the present disclosure is described as follows. In the present embodiment, the chip testing method further includes a temperature adjusting step SX4 and the testing step SX5 after the temperature adjusting step SX2 and the testing step SX3. The temperature adjusting step SX4 is implemented by controlling the temperature adjusting device E34 of the accommodating chamber E311 so that the chips C are in an environment having a temperature (e.g., an ambient temperature) within a range of 20° C. to 30° C. The testing step SX5 is implemented by providing electricity to the chip testing device 1 in the accommodating chamber E311, so that each of the testing modules 30 performs the predetermined testing process on the chips C connected thereto. In other words, the chips C in the temperature adjusting step SX2 and the testing step SX3 are tested under a low temperature environment, and the chips C in the temperature adjusting step SX4 and the testing step SX5 are tested under a normal temperature environment.

Figure 24:
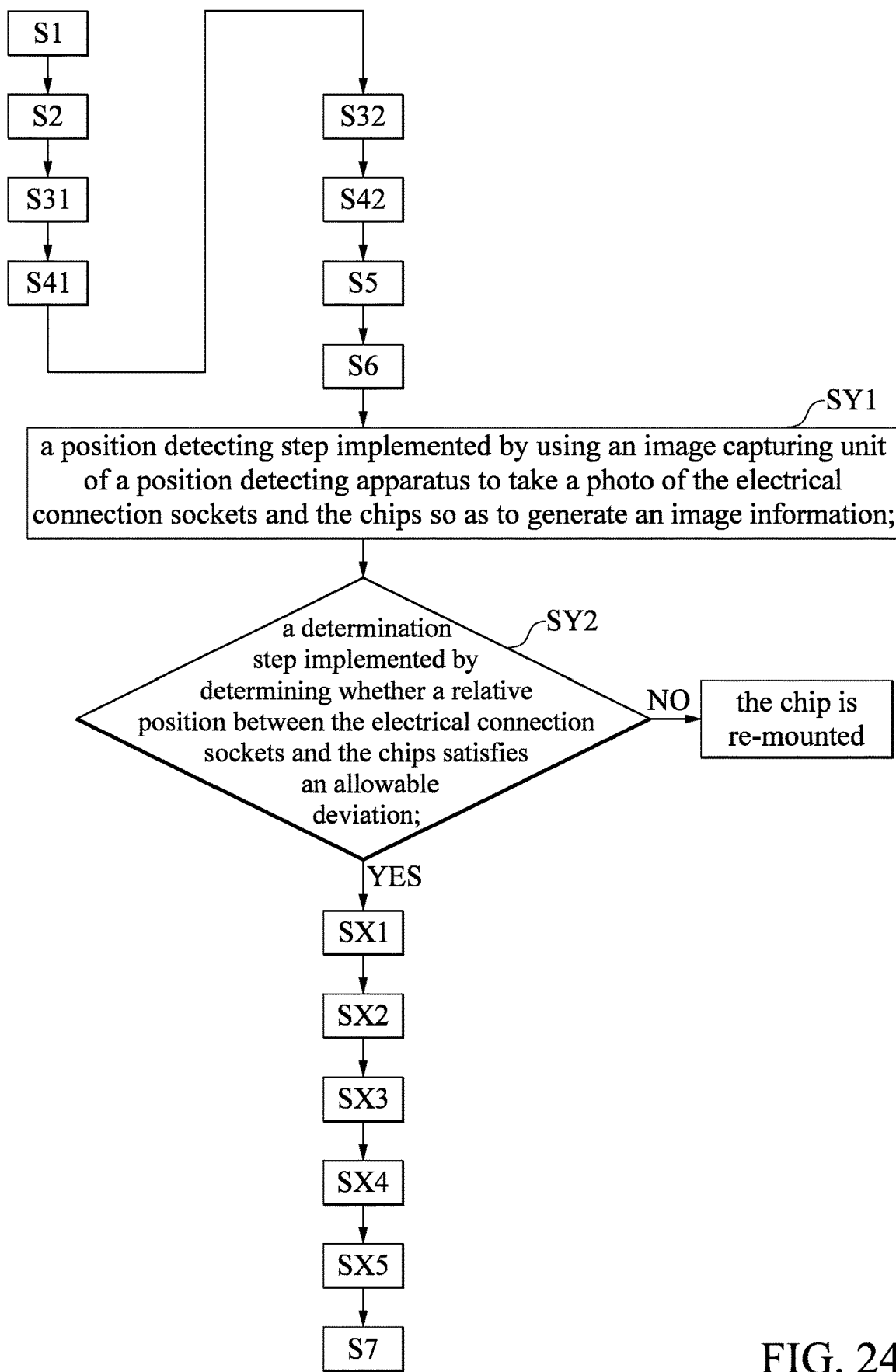
FIG. 24 is a flow chart showing a chip testing method that is implemented by using the chip testing system according to a ninth embodiment of the present disclosure.

FIG. 24 is a flow chart of a chip testing method according to a ninth embodiment of the present disclosure. The chip testing system E of the present embodiment is configured to test a plurality of memory chips (i.e., the chips C) by implementing the chip testing method. The difference between the chip testing method in the present embodiment and the above embodiments of the present disclosure is described as follows. When the chip testing device 1 is in contact with the contacting structure E34A1, E34B1, or E343 to complete the predetermined testing process, and the chip testing device 1 is moved out of the accommodating chamber E311 (i.e., after any one of the moving-out step is implemented), the chip testing method of the present embodiment can further include steps as follows: a position detecting step SY1 implemented by using an image capturing unit of a position detecting apparatus E8 to take a photo of the electrical connection sockets 2 and the chips C so as to generate an image information; and a determination step SY2 implemented by determining whether a relative position between the electrical connection sockets 2 and the chips C satisfies an allowable deviation. Specifically, if the relative position between the electrical connection sockets 2 and the chips C satisfies the allowable deviation, the chip testing device 1 is transferred to a next working station (e.g., the classification apparatus E5) or another one of the accommodating chambers E311, so that the chips C can be tested under different temperature. If the relative position between the electrical connection sockets 2 and the chips C does not satisfy the allowable deviation, the chips C are re-mounted onto the electrical connection sockets 2.

In a practical application, if the relative position between the electrical connection sockets 2 and the chips C does not satisfy the allowable deviation, the transferring apparatus E4 is controlled by the central control device E1 to transfer the chip testing device 1 onto the chip mounting apparatus E2, and the chip mounting apparatus E2 is used to re-mount a specific one of the chips C or all of the chips C. In addition, the chips C on the chip testing device 1 can be re-mounted by a robotic arm other than the chip mounting apparatus E2, or the transferring apparatus E4 can be controlled by the central control device E1 to transfer the chip testing device 1 onto a temporary region and to emit a signal for a relevant personnel. In other embodiments of the present disclosure, the position detecting apparatus E8 can include a chip mounting device (e.g., a carrier and a robotic arm) that can be used to directly re-mount at least one of the chips C on the chip testing device 1. The position detecting step SY1 and the determination step SY2 of the present embodiment can be implemented after any moving-out step (e.g., the chip testing device 1 is moved out of the corresponding accommodating chamber E311) according to design requirements.

As shown in FIG. 1 and FIG. 3, the chip testing system E can further include two image capturing units E91, E92 connected to the central control device E1. The image capturing unit E91 is arranged adjacent to the chip mounting apparatus E2. The chip mounting apparatus E2 is used to dispose the chips C onto the chip testing device 1, and the image capturing unit E91 is used to take a photo of the chip testing device 1 and the chips C disposed thereon. The central control device E1 can determine whether the chips C are correctly disposed on the chip testing device 1 by receiving an image information from the image capturing unit E91. If the central control device E1 determines that chips C are not correctly disposed on the chip testing device 1, the central control device E1 can control the chip mounting apparatus E2 to re-mount the chips C.

The image capturing unit E91 is arranged adjacent to the classification apparatus E5, and is used to take a photo of the chips C on a defective product region or a good product region. The central control device E1 can determine whether the chips C are correctly disposed on the tray by receiving an image information from the image capturing unit E92. If the central control device E1 determines that chips C are not correctly disposed on the tray, the central control device E1 can control the classification apparatus E5, the chip mounting apparatus E5, or an adjacent robotic arm to re-mount the chips C.

As shown in FIG. 1, the chip testing system E in the present disclosure can further include a pre-test apparatus E6 connected to the central control device E1. The pre-test apparatus E6 can include at least one electrical connection socket that can be identical to the electrical connection socket 2 shown in FIG. 5 and FIG. 6. The electrical connection socket of the pre-test apparatus E6 is used to carry one chip C. The pre-test apparatus E6 is configured to perform an open/short test and a leakage current test on the chip C. In a specific application, the pre-test apparatus E6 can include a testing device that is similar to the chip testing device 1 shown in FIG. 3, thereby testing the chip C disposed thereon.

In an embodiment of the present disclosure, the chip testing system E is applied to test memory chips (e.g., NAND flash), and the testing device of the pre-test apparatus E6 can be used to perform the open/short test and the leakage current test on the memory chips (i.e., the chips C), thereby effectively increasing the testing performance. Specifically, the high temperature test, the burn-in test, the low temperature test, and the normal temperature test for the memory chips can result in significant waste of time, so that the pre-test apparatus E6 can be used to preliminarily filter the memory chips. Accordingly, the memory chips not passing the open/short test or the leakage current test are not occupied on the electrical connection sockets 2 in the following steps, and the effective use of each of the electrical connection sockets 2 of the chip testing device 1 can be ensured. In addition, according to design requirements, the pre-test apparatus E6 can be used to further perform a specific DC electrical property test or a read ID test on the memory chips.

In other embodiments of the present disclosure, the chip testing method can further include a final testing step before the classification step S7. The final testing step includes: a mounting step implemented by mounting the chips onto a plurality of electrical connection sockets of a final testing apparatus; a testing step implemented by controlling the final testing apparatus to perform an open/short test and a leakage current test on the chips on the final testing apparatus; and a determination step implemented by determining whether the chips on the final testing apparatus pass the open/short test and the leakage current test. Specifically, any one of the chips not passing the open/short test or the leakage current test is placed to the defective product region in the classification step S7.

Each of the electrical connection sockets of the final testing apparatus can be identical to the electrical connection socket 2 shown in FIG. 5 and FIG. 6, and the present disclosure is not limited thereto. The final testing apparatus can be provided to increase the classifying speed of the classification apparatus. Specifically, when the classification apparatus is used to classify the chips, each of the chips is moved to a corresponding region according to a test result from the testing steps thereof. However, when one of the chips has unexpected damage in the testing process and does not pass any test, the classification apparatus would waste time in classifying the damaged chip if the chip testing method does not include the final testing step. In a practical application, the final testing apparatus, the chip mounting apparatus E2, and the pre-test apparatus E6 can share the same robotic arm to perform a mounting process of the chip, but the present disclosure is not limited thereto. For example, each of the final testing apparatus, the chip mounting apparatus E2, and the pre-test apparatus E6 can be provided with an independent robotic arm.

Figure 25:
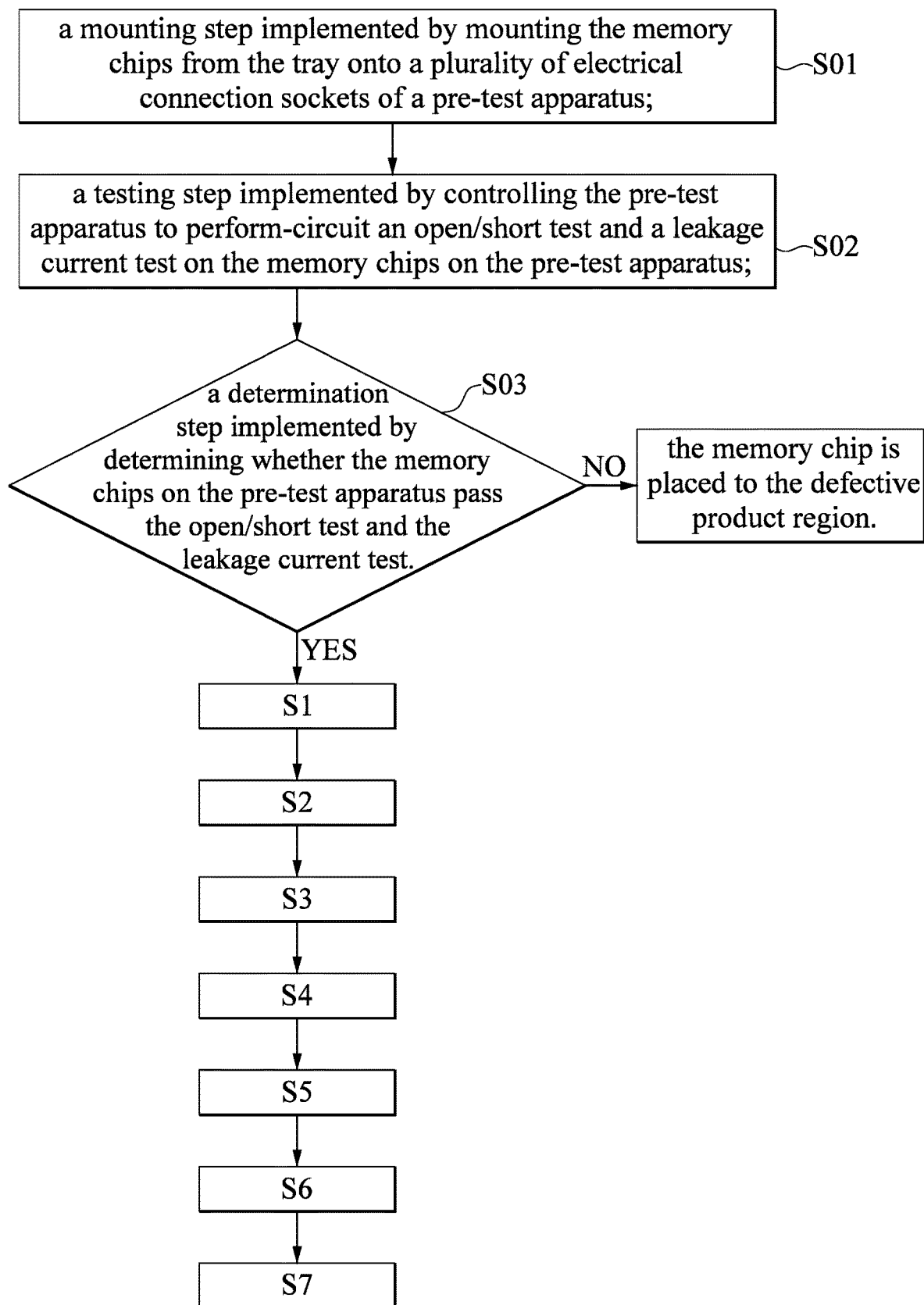
FIG. 25 is a flow chart showing a chip testing method that is implemented by using the chip testing system according to a tenth embodiment of the present disclosure.

FIG. 25 is a flow chart of a chip testing method according to a tenth embodiment of the present disclosure. The chip testing system E of the present embodiment is configured to test a plurality of memory chips (i.e., the chips C) by implementing the chip testing method. The difference between the chip testing method in the present embodiment and the above embodiments of the present disclosure is described as follows. The chip testing method of the present embodiment can further include a pre-test step before the chip mounting step S1. The pre-test includes: a mounting step S01 implemented by mounting the memory chips (i.e., the chips C) from the tray onto a plurality of electrical connection sockets of a pre-test apparatus E6; a testing step S02 implemented by controlling the pre-test apparatus E6 to perform an open/short test and a leakage current test on the memory chips (i.e., the chips C) on the pre-test apparatus E6; and a determination step S03 implemented by determining whether the memory chips (i.e., the chips C) on the pre-test apparatus E6 pass the open/short test and the leakage current test. Specifically, any one of the memory chips (i.e., the chips C) passing the open/short test and the leakage current test is used for the chip mounting step S1, and any one of the memory chips (i.e., the chips C) not passing the open/short test or the leakage current test is placed to the defective product region A2.

As shown in FIG. 1, the pre-test apparatus E6 can be arranged between the tray apparatus E7 and the chip mounting apparatus E2, and the pre-test apparatus E6, the tray apparatus E7, and the chip mounting apparatus E2 can be provided with at least robotic arm there-among. The robotic arm can be used to transfer the memory chips (i.e., the chips C) from the tray onto the electrical connection sockets of the pre-test apparatus E6. If the memory chip (i.e., the chip C) passes the open/short test and the leakage current test, the robotic arm transfers the memory chip (i.e., the chip C) to the electrical connection socket 2 of the chip testing device 1. If the memory chip (i.e., the chip C) does not pass the open/short test or the leakage current test, the robotic arm transfers the memory chip (i.e., the chip C) to another defective product region A3. In a practical application of the present disclosure, the chip mounting apparatus E2 and the pre-test apparatus E6 can share the same robotic arm to transfer the chip, but the present disclosure is not limited thereto. In other embodiments of the present disclosure, the chip mounting apparatus E2 and the pre-test apparatus E6 can be provided with an independent robotic arm.

Figure 26:
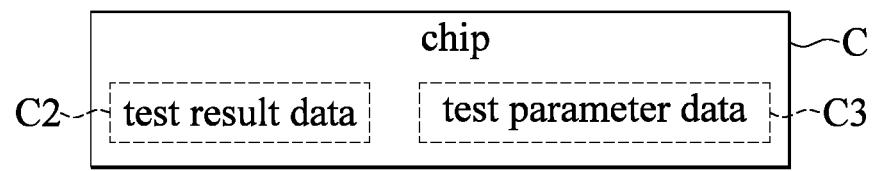
FIG. 26 is a functional block view showing a memory chip that passes the test of the chip testing system according to the present disclosure.

As shown in FIG. 26, after each of the testing modules 30 performs the predetermined testing process on the chips C on the electrical connection sockets 2 connected thereto, the testing modules 30 can write the test result data C2 and the test parameter data C3 into the corresponding chip C, so that each of the chips C has the test result data C2 and the test parameter data C3.

Specifically, the test result data C2 can be used to present testing states of the chip C in the high temperature test, the burn-in test, the low temperature test, and the normal temperature test; or the test result data C2 can be used to present records of the chip C that passes or does not pass the high temperature test, the burn-in test, the normal temperature test, or the low temperature test.

The test parameter data C3 can include: ID number of the chip testing device 1, ID number of the testing module 30, ID number of the electrical connection socket 2, ID number of the environment control apparatus E3, ID number of the accommodating chamber E311, time and temperature in the high temperature test, time and temperature in the burn-in test, time and temperature in the low temperature test, and time and temperature in the normal temperature test.

Since the test result data C2 and the test parameter data C3 are written in the chip C through the testing module 30, when a consumer obtains any one of the chips C, the consumer can confirm the testing state of the chip C by using a relevant apparatus to read the data in the chip C. Moreover, when a production staff receives a chip C sent back from a consumer, the testing state of the chip C can be quickly obtained by reading the test result data C2 and the test parameter data C3 in the chip C, thereby effectively helping the production staff to find defects in the testing process.

Figure 27:
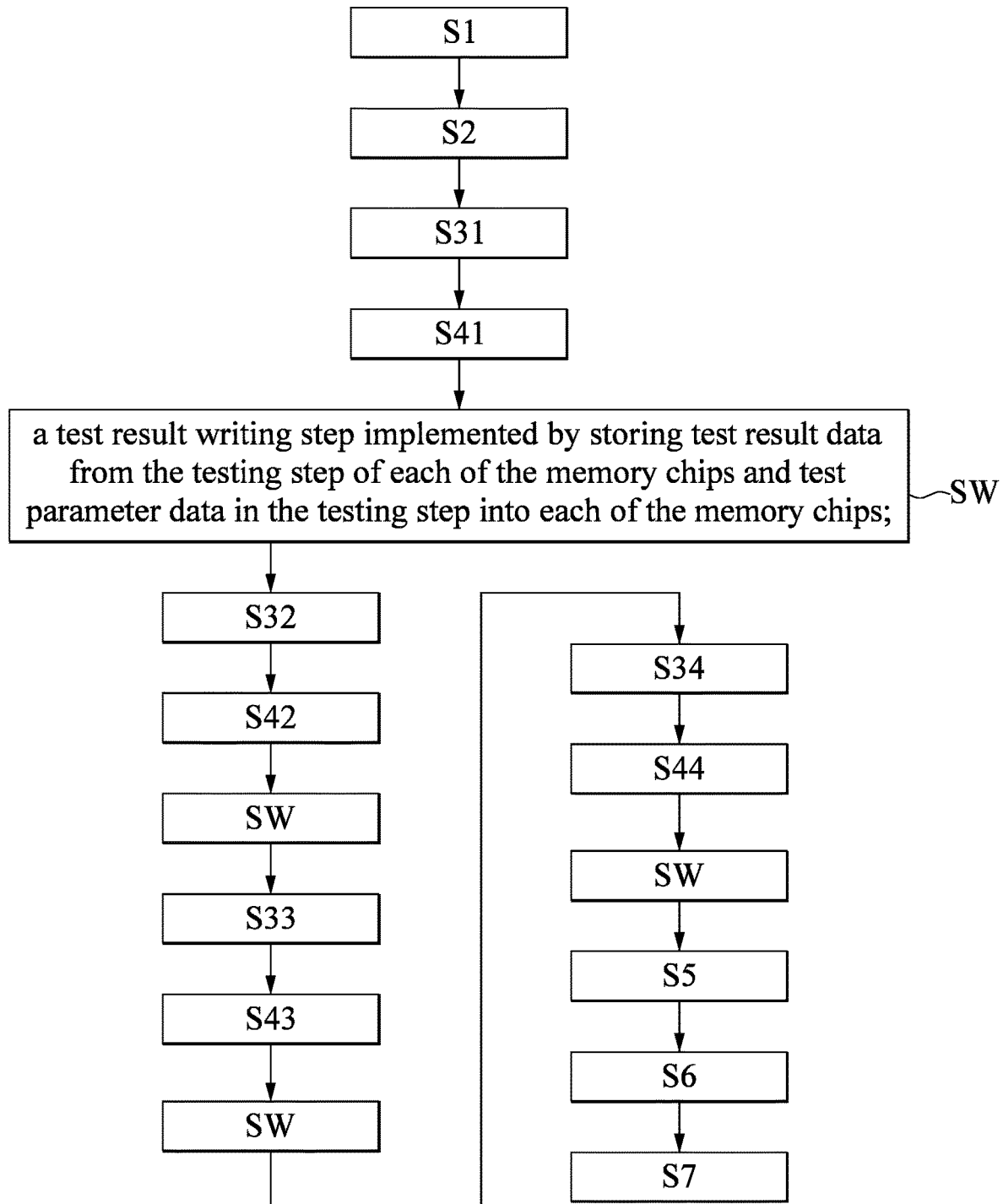
FIG. 27 is a flow chart showing a chip testing method that is implemented by using the chip testing system according to an eleventh embodiment of the present disclosure.

FIG. 27 is a flow chart of a chip testing method according to an eleventh embodiment of the present disclosure. The chip testing system E of the present embodiment is configured to test a plurality of memory chips (i.e., the chips C) by implementing the chip testing method. The difference between the chip testing method in the present embodiment and the above embodiments of the present disclosure is described as follows. The chip testing method of the present embodiment can further include a test result writing step SW after each of the testing steps is implemented. The test result writing step SW is implemented by storing test result data from the testing step of each of the memory chips and test parameter data in the testing step into each of the memory chips.

In the present embodiment, after each of the testing modules 30 performs any one test (e.g., the high temperature test, the burn-in test, the low temperature test, or the normal temperature test) on the memory chips connected thereto, the test result data and the test parameter data are immediately stored into the corresponding memory chip, but the present disclosure is not limited thereto.

As shown in FIG. 4, each of the testing modules 30 can include a processing unit 5 and at least one storage unit 6. After each of the testing modules 30 performs any test (e.g., the high temperature test, the burn-in test, the low temperature test, or the normal temperature test) on the memory chips on the electrical connection sockets 2 connected thereto, each of the testing modules 30 can be used to store the test result data and the test parameter data of the memory chips into the storage unit 6 thereof, but each of the testing modules 30 is not used to store the test result data and the test parameter data into the corresponding memory chip. In other embodiments of the present disclosure, the chip testing device 1 can include a storage unit, and each of the testing modules 30 can be used to store the test result data and the test parameter data of the memory chips into the storage unit of the chip testing device 1. In other words, the chip testing device 1 can include the storage unit 6 that is arranged in each of the testing modules 30 or is independent from the testing modules 30 according to design requirements.

After the memory chips on the chip testing device 1 are tested with all of the tests (e.g., the burn-in test and the high temperature test; or the high temperature test, the burn-in test, the low temperature test, or the normal temperature test) according to practical requirements, the central control device E1 can control a read-write apparatus (not shown) to be connected to the connection terminals of the power supply member 4 of the chip testing device 1, so that the test result data C2 and the test parameter data C3 stored in the storage unit of the chip testing device 1 or the storage unit 6 of each of the testing modules 30 can be read and written into the corresponding memory chip by the read-write apparatus.

In an embodiment of the present disclosure, the chip testing device 1 can include a wireless transmission unit 7 connected to the processing unit 5. After each of the testing modules 30 performs the predetermined testing process on the chips on the electrical connection sockets 2 connected thereto, each of the testing modules 30 generates the test result data C2 and the test parameter data C3. The processing unit 5 can receive the test result data C2 and the test parameter data C3 transmitted from each of the testing modules 30, and can control the wireless transmission unit 7 to wirelessly transmit the test result data C2 and the test parameter data C3 to an external electronic device that can be the central control device E1. After that, the central control device E1 can write the test result data C2 and the test parameter data C3 into the corresponding memory chip through the read-write apparatus.

Figure 28:
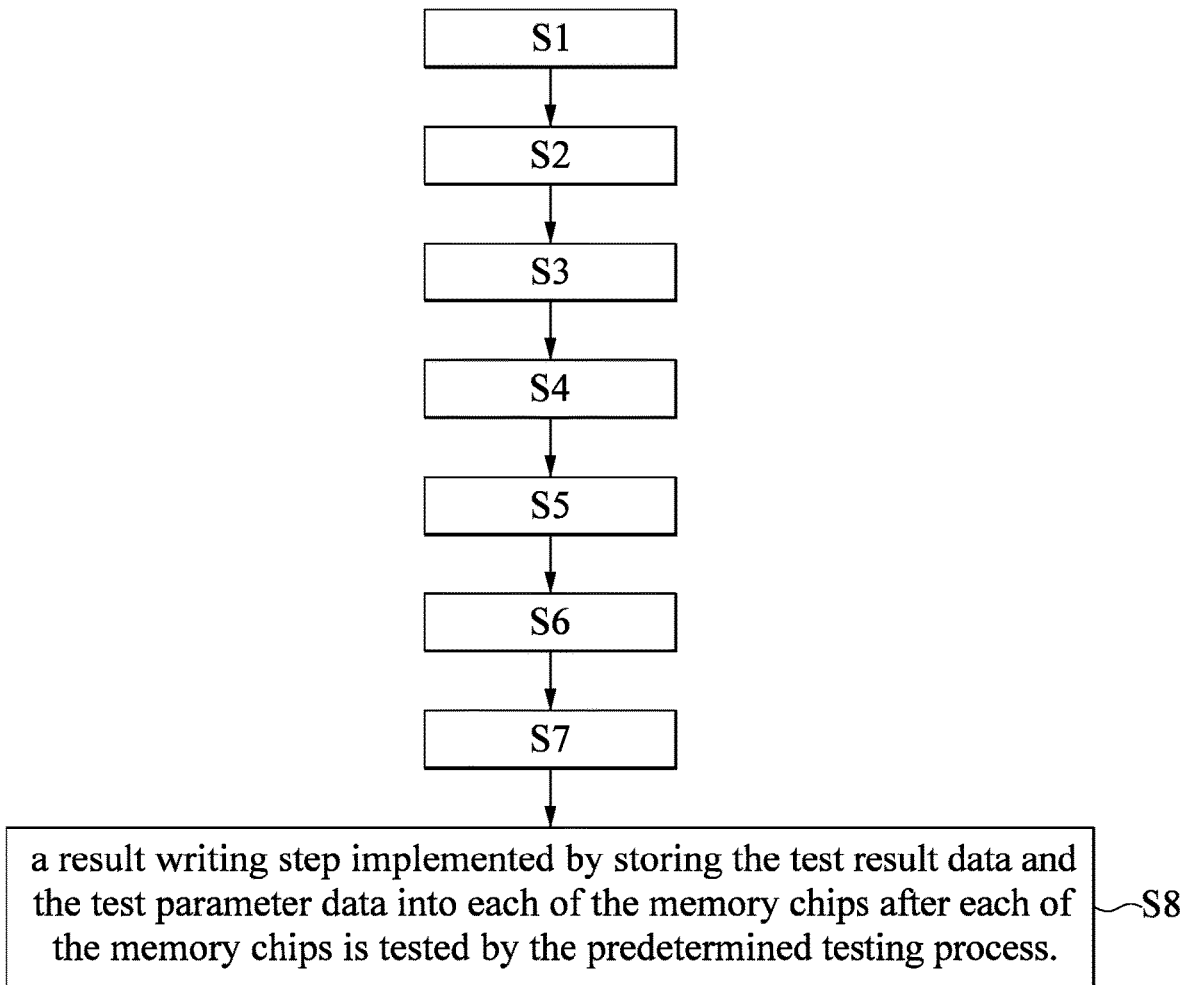
FIG. 28 is a flow chart showing a chip testing method that is implemented by using the chip testing system according to a twelfth embodiment of the present disclosure.

FIG. 28 is a flow chart of a chip testing method according to a twelfth embodiment of the present disclosure. The difference between the chip testing method in the present embodiment and the embodiment shown in FIG. 16 is described as follows. The chip testing method of the present embodiment can further include a result writing step S8 after the classification step S7. The result writing step S8 is implemented by storing the test result data and the test parameter data into each of the memory chips after each of the memory chips is tested by the predetermined testing process.

Specifically, after the memory chips on the chip testing device 1 are tested with all of the tests (e.g., the burn-in test and the high temperature test; or the high temperature test, the burn-in test, the low temperature test, or the normal temperature test) according to design requirements, the central control device E1 can control the classification apparatus E5 to classify the memory chips according to the test results of the memory chips. After that, the central control device E1 can control the read-write apparatus to perform a read-write process on the memory chips classified to the good product region A1, thereby storing the test result data C2 and the test parameter data C3 into the corresponding memory chip. In other words, the test result data C2 and the test parameter data C3 are only stored into the memory chip classified to the good product region A1.

Figure 29:
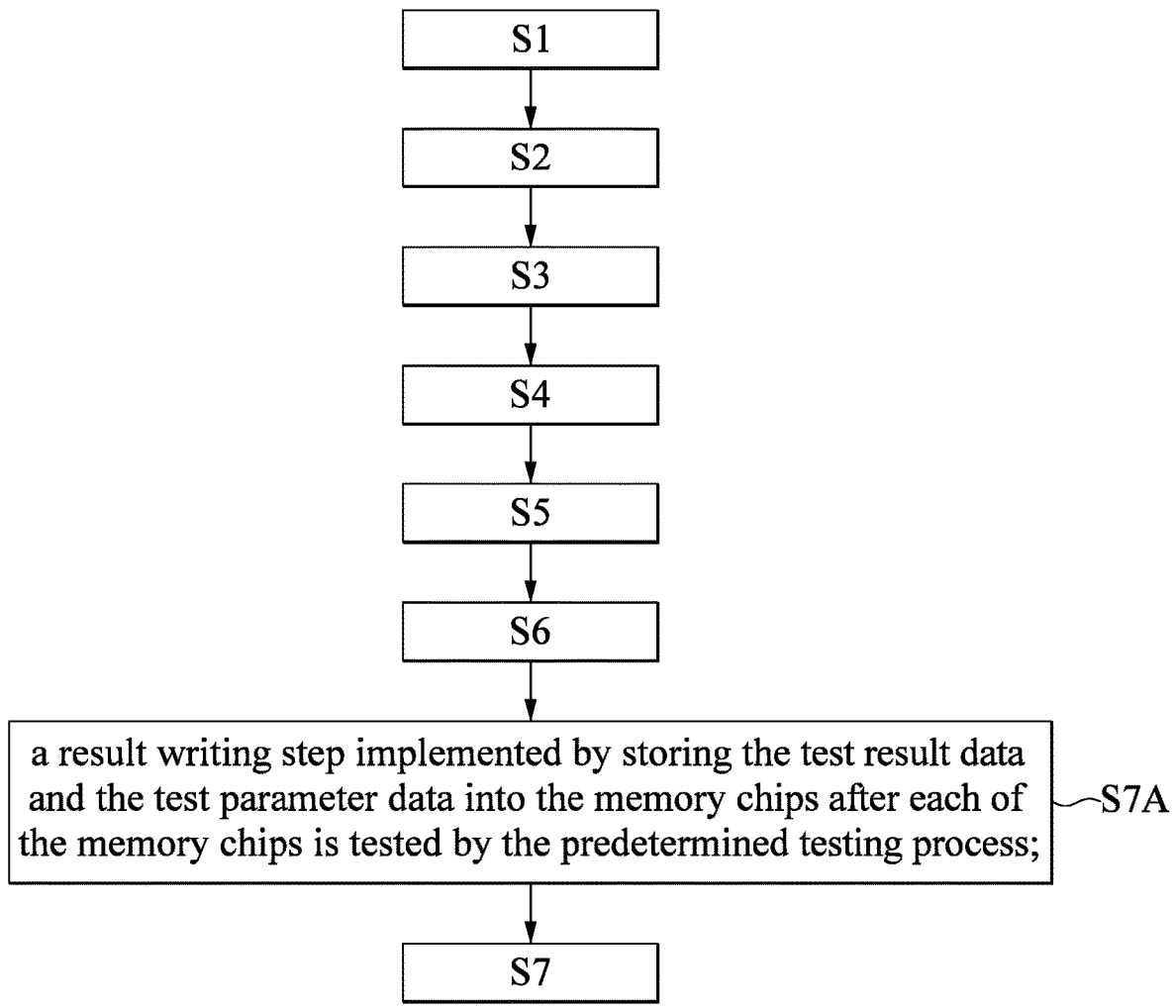
FIG. 29 is a flow chart showing a chip testing method that is implemented by using the chip testing system according to a thirteenth embodiment of the present disclosure.

FIG. 29 is a flow chart of a chip testing method according to a thirteenth embodiment of the present disclosure. The difference between the chip testing method in the present embodiment and the embodiment shown in FIG. 16 is described as follows. The chip testing method of the present embodiment can further include a result writing step S7A before the classification step S7. The result writing step S7A is implemented by storing the test result data and the test parameter data into the memory chips after each of the memory chips is tested by the predetermined testing process.

Specifically, after the memory chip on the chip testing device 1 passes all of the tests (e.g., the burn-in test and the high temperature test; or the high temperature test, the burn-in test, the low temperature test, or the normal temperature test) according to design requirements, the chip testing device 1 would write the test result data and the test parameter data into the memory chip. However, if the memory does not pass at least one of the tests, the chip testing device 1 does not write any test result data and any test parameter data into the memory chip. Accordingly, in the classification step S7, the classification apparatus can quickly determine whether the memory chip passes the tests according to the interior data of the memory chip. In other words, if the classification apparatus determines that the memory chip is not written with the data, the classification apparatus would directly classify the memory chip to the defective product region.

Figure 30:
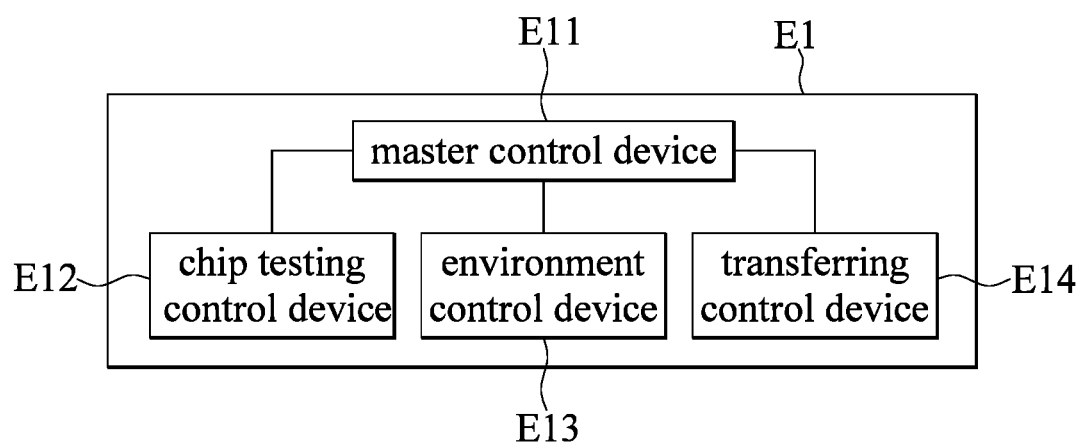
FIG. 30 is a functional block view of a central control device according to the present disclosure.

As shown in FIG. 30, the central control device E1 of the chip testing system E can include a master control device E11, a chip testing control device E12, an environment control device E13, and a transferring control device E14. The number of any one of the chip testing control device E12, the environment control device E13, and the transferring control device E14 can be changed according to design requirements, and is not limited to one.

In an embodiment of the present disclosure, the number of the chip testing control device E12 of the chip testing system E is one, and the chip testing control device E12 is configured to control the chip testing devices 1, the pre-test apparatus E6, and the final testing apparatus to be operated for performing each testing process to the chips. In other words, the chip testing control device E12 is used to control any apparatus that is used for testing the chips. In an embodiment of the present disclosure, the number of the chip testing control device E12 of the chip testing system E is more than one, each of the chip testing control devices E12 can control at least one of the chip testing devices 1, and the different chip testing control devices E12 can control the corresponding chip testing devices 1 to respectively perform different testing processes.

In an embodiment of the present disclosure, the number of the environment control device E13 of the chip testing system E is one, and the environment control device E13 is configured to control any one of the environment control apparatuses E3 to be operated. For example, the environment control device E13 can control the temperature adjusting device E34, the air suction device E37, the lift device E38, and the retaining device E39 of the environment control apparatuses E3 to be operated. In an embodiment of the present disclosure, the number of the environment control device E13 of the chip testing system E is more than one, each of the environment control devices E13 can control at least one of the environment control apparatuses E3, and the different environment control devices E13 can control the corresponding environment control apparatuses E3 to respectively perform different operations. It should be noted that each of the environment control devices E13 can control each component (e.g., each sensor) of each of the environment control apparatuses E3 to be operated.

In an embodiment of the present disclosure, the number of the transferring control device E14 of the chip testing system E is one, and the transferring control device E14 is configured to control the chip mounting apparatus E2, the position detecting apparatus E8, the transferring apparatus E4, and the classification apparatus E5. In other words, the transferring control device E14 can control any apparatus that is used for transferring the chip testing device 1 or the chip. In an embodiment of the present disclosure, the number of the transferring control device E14 of the chip testing system E is more than one, and the transferring control devices E14 are respectively configured to control different apparatuses according to design requirements. For example, only one of the transferring control devices E14 can be used specifically for controlling an apparatus for transferring the chip testing device 1, and another one of the transferring control devices E14 can be used specifically for controlling an apparatus for transferring the chip.

The master control device E11 is connected to the chip testing control device E12, the environment control device E13, and the transferring control device E14. The master control device E11 can be configured to control the cooperation of the chip testing control device E12, the environment control device E13, and the transferring control device E14. In a specific application, any one of the master control device E11, the chip testing control device E12, the environment control device E13, and the transferring control device E14 can be a computer or a server, but the present disclosure is not limited thereto.

Since the chip testing system E includes the master control device E11, the chip testing control device E12, the environment control device E13, and the transferring control device E14, the control units of the chip testing system E in a manufacturing process are easy to be integrated, and problems in connection with the chip testing system E in operation or under maintenance can be easily and quickly found.

In any one of the above embodiments, the chip testing device 1 is not limited to receiving electricity in the testing step. For example, the chip testing device 1 can receive electricity at a time point after being arranged in the accommodating chamber E311 and before performing the testing step. Specifically, the chip testing device 1 can immediately receive electricity when being arranged in the accommodating chamber E311 or performing the testing step.

In an embodiment of the present disclosure, any of the power supply members including the connection terminals, the connection terminals and the chamber terminals can each be replaced by the receiving antennas and the emitting antennas. Moreover, since the receiving antenna and the emitting antenna are used to transmit electricity in a wireless manner, when the connection terminals and the chamber terminals are replaced by the receiving antennas and the emitting antennas, the processes of the above embodiments for connecting or separating the connection terminals and the chamber terminals can be omitted.

In conclusion, the chip testing system, the chip testing device, and the chip testing method of the present disclosure, when compared to the conventional chip testing apparatus, can have a cost advantage and a better test efficiency. In addition, the chip testing system of the present disclosure is configured to use the chip testing device to carry the chips, and the chip testing device can be moved to allow the chips to be tested under different temperature environments, so that the chips can be disposed on the same chip testing device in the entirety of the testing steps without being repeatedly detached or mounted. Accordingly, the chip testing system of the present disclosure can be used to effectively prevent unexpected damage to the chips. However, the conventional memory testing apparatus is used to repeatedly detach and mount a memory chip to electrical connection sockets that are distributed in different temperature environments, so that unexpected damage can easily occur in the memory chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip testing device for carrying a plurality of chips and being transferred among a plurality of working stations through a transferring device, the chip testing device comprising:
a circuit board having a first board surface and a second board surface respectively defined by two opposite sides thereof;
a plurality of electrical connection sockets fixed onto the first board surface of the circuit board, wherein each of the electrical connection sockets is configured to carry one of the chips, the electrical connection sockets are divided into a plurality of socket groups, and each of the socket groups has at least one of the electrical connection sockets;
a control set disposed on the second board surface of the circuit board and including a plurality of testing modules, wherein the testing modules are connected to the socket groups, and each of the testing modules is connected to the at least one of the electrical connection sockets of the corresponding socket group; and
at least one power supply member connected to the circuit board,
wherein the chip testing device is connected to an external power supply apparatus through the at least one power supply member so as to receive electricity for an operation of each of the testing modules, and
wherein when the chip testing device receives electricity provided from the external power supply apparatus through the at least one power supply member, each of the testing modules is allowed to perform a predetermined testing process on at least one of the chips disposed on the at least one of the electrical connection sockets of the corresponding socket group connected thereto.

2. The chip testing device according to claim 1, wherein each of the chips is a memory chip, and the predetermined testing process includes at least one of a reading test, a writing test, and an electrical property test.

3. The chip testing device according to claim 2, wherein each of the testing modules includes a pattern generator (PG), a device power supply (DPS), and a driver.

4. The chip testing device according to claim 2, wherein the power supply member includes a plurality of connection terminals disposed on the circuit board, the connection terminals are configured to be connected to a plurality of chamber terminals of at least one of the working stations, and when the connection terminals are connected to the chamber terminals, the external power supply apparatus is allowed to provide electricity to the chip testing device.

5. The chip testing device according to claim 2, wherein the power supply member includes a receiving antenna that is configured to be coupled with an emitting antenna of the external power supply apparatus, and the chip testing device is configured to receive electricity provided from the external power supply apparatus through the receiving antenna in a wireless manner.

6. The chip testing device according to claim 2, further comprising a plurality of first data transmission terminals disposed on the circuit board, wherein the first data transmission terminals are configured to transmit data to a plurality of second data transmission terminals of at least one of the working stations.

7. The chip testing device according to claim 2, further comprising a plurality of first data transmission antennas, wherein the first data transmission antennas are configured to wirelessly transmit data to a plurality of second data transmission antennas of at least one of the working stations.

8. The chip testing device according to claim 2, wherein each of the chips is a memory chip, after each of the testing modules performs the predetermined testing process on the at least one of the chips disposed on the at least one of the electrical connection sockets of the corresponding socket group connected thereto, test result data and test parameter data of each of the chips are stored into each of the chips through the corresponding testing module, so that each of the chips has the test result data and the test parameter data.

9. The chip testing device according to claim 2, wherein each of the testing modules includes at least one storage unit and a processing unit, after each of the testing modules performs the predetermined testing process on the at least one of the chips disposed on the at least one of the electrical connection sockets of the corresponding socket group connected thereto, the processing unit is allowed to store test result data and test parameter data of each of the chips into the at least one storage unit.

10. The chip testing device according to claim 9, wherein after each of the testing modules performs the predetermined testing process on the at least one of the chips disposed on the at least one of the electrical connection sockets of the corresponding socket group connected thereto, the processing unit of each of the testing modules is allowed to selectively write the test result data and the test parameter data into the at least one of the chips according to the test result data.

11. The chip testing device according to claim 2, further comprising a processing unit and a wireless transmission unit, wherein the processing unit is connected to the testing modules, and the wireless transmission unit is connected to the processing unit, wherein after each of the testing modules performs the predetermined testing process on the at least one of the chips disposed on the at least one of the electrical connection sockets of the corresponding socket group connected thereto, each of the testing modules generates test result data and test parameter data, and wherein the processing unit is allowed to receive the test result data and the test parameter data transmitted from each of the testing modules, and is allowed to control the wireless transmission unit to wirelessly transmit the test result data and the test parameter data transmitted from each of the testing modules to an external electrical device.

12. The chip testing device according to claim 1, wherein each of the electrical connection sockets includes:
a socket body having a top wall and an annular wall, wherein the top wall has an opening, one end of the annular wall is connected to a peripheral edge of the top wall, and another end of the annular wall is disposed on the circuit board, and wherein the top wall, the annular wall, and the circuit board jointly define an accommodating slot, the top wall has an outer surface and an inner surface respectively defined by two opposite sides thereof, and the inner surface is arranged in the accommodating slot;

a supporting structure disposed on the circuit board and arranged in the accommodating slot;

a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, the retaining portions and the carrying portion jointly define a chip receiving slot for receiving one of the chips, and wherein the lift structure has a plurality of connection holes penetrating through the base portion and the carrying portion;

at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and a plurality of probe assemblies connected to the circuit board, wherein one end of the probe assemblies is fixed to the supporting structure, and another end of the probe assemblies is arranged in the connection holes, wherein in each of the electrical connection sockets, when the chip receiving slot receives the corresponding chip, and the retaining portion is not pressed by a pressing device, the probe assemblies in the connection holes are not in contact with a plurality of electrical connection portions of the corresponding chip, and wherein in each of the electrical connection sockets, when the chip receiving slot receives the corresponding chip, and the retaining portion is pressed to move into the socket body by the pressing device, the probe assemblies are abutted against the electrical connection portions, so that the probe assemblies and the corresponding chip are connected to each other.

13. The chip testing device according to claim 12, wherein in each of the electrical connection sockets, when the chip receiving slot receives the corresponding chip, and the retaining portion is pressed to move into the socket body by the pressing device, a portion of each of the probe assemblies protrudes from the corresponding connection hole.

14. The chip testing device according to claim 12, wherein in each of the electrical connection sockets, the lift structure is entirely moved into the socket body by being pressed.

15. The chip testing device according to claim 1, wherein any one of the electrical connection sockets of each of the socket groups is not connected to any one of the electrical connection sockets of the other socket groups.

\* \* \* \* \*